(12) United States Patent
Seo et al.

(10) Patent No.: US 11,987,665 B2
(45) Date of Patent: May 21, 2024

(54) POLYMER AND ORGANIC LIGHT EMITTING DEVICE COMPRISING SAME

(71) Applicant: LG Chem, Ltd., Seoul (KR)

(72) Inventors: Seog Jae Seo, Daejeon (KR); Jaesoon Bae, Daejeon (KR); Esder Kang, Daejeon (KR); Daeho Kim, Daejeon (KR); Keunsoo Lee, Daejeon (KR); Beomgoo Kang, Daejeon (KR); Min Suk Jung, Daejeon (KR); Jaechol Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 503 days.

(21) Appl. No.: 17/203,143

(22) Filed: Mar. 16, 2021

(65) Prior Publication Data

US 2021/0206909 A1 Jul. 8, 2021

Related U.S. Application Data

(63) Continuation-in-part of application No. PCT/KR2019/014282, filed on Oct. 28, 2019.

(30) Foreign Application Priority Data

Nov. 13, 2018 (KR) .......................... 10-2018-0139332

(51) Int. Cl.
*C08G 61/04* (2006.01)
*H10K 50/15* (2023.01)
(Continued)

(52) U.S. Cl.
CPC ............ *C08G 61/04* (2013.01); *H10K 85/111* (2023.02); *C08G 2261/11* (2013.01);
(Continued)

(58) Field of Classification Search
CPC .... H10K 85/111; H10K 85/151; H10K 50/17; H10K 50/15; C08F 212/32;
(Continued)

(56) References Cited

U.S. PATENT DOCUMENTS

2004/0251816 A1 12/2004 Leo et al.
2009/0088550 A1 4/2009 Shinohara et al.
(Continued)

FOREIGN PATENT DOCUMENTS

JP H08259935 A 10/1996
JP H10310606 A 11/1998
(Continued)

OTHER PUBLICATIONS

Zhang X, Shen W, Sun H, Yu P, He R, Li M. The DFT study on non-conjugated polymer host materials based on styrene derivatives for phosphorescent polymer light-emitting diodes. Journal of Physical Organic Chemistry. Aug. 2015;28(8):554-63.
(Continued)

*Primary Examiner* — Shane Fang
(74) *Attorney, Agent, or Firm* — Lerner David LLP

(57) ABSTRACT

The present invention provides a novel polymer comprising repeating unit represented by the following Chemical Formula 1, and an organic light emitting device including the same:

(Continued)

[Chemical Formula 1]

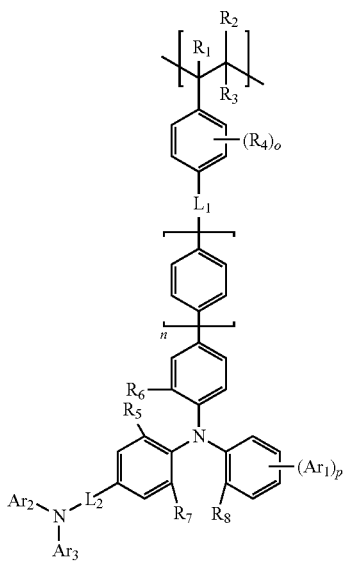

Wherein $L_1$, $L_2$, $Ar_1$, $Ar_2$, $Ar_3$, $R_1$ to $R_8$, o, p and n are described herein.

12 Claims, 1 Drawing Sheet

(51) Int. Cl.
 *H10K 50/16* (2023.01)
 *H10K 85/10* (2023.01)
(52) U.S. Cl.
 CPC ........... *C08G 2261/1414* (2013.01); *C08G 2261/142* (2013.01); *C08G 2261/143* (2013.01); *C08G 2261/146* (2013.01); *C08G 2261/3241* (2013.01); *C08G 2261/512* (2013.01); *C08G 2261/514* (2013.01); *C08G 2261/52* (2013.01); *C08G 2261/95* (2013.01); *H10K 50/15* (2023.02); *H10K 50/16* (2023.02)
(58) Field of Classification Search
 CPC .... C09D 125/18; C09D 165/00; C08G 61/12; C08G 2261/12; C08G 2261/1412; C08G 2261/1424; C08G 2261/148; C08G 2261/195; C08G 2261/3162; C08G 2261/76; C08G 2261/95; C08L 79/02; H01L 51/0039; H01L 51/0043; H01L 51/5056; H01L 51/5072; H01L 51/5088; H01L 51/5092; H01L 51/56
 See application file for complete search history.

(56) References Cited

U.S. PATENT DOCUMENTS

| | | |
|---|---|---|
| 2012/0018710 A1 | 1/2012 | Eida et al. |
| 2014/0072341 A1 | 3/2014 | Sasaki et al. |
| 2015/0094437 A1 | 4/2015 | Caille et al. |
| 2016/0091804 A1 | 3/2016 | Nukada et al. |
| 2016/0225998 A1 | 8/2016 | Kato et al. |

FOREIGN PATENT DOCUMENTS

| | | |
|---|---|---|
| JP | 2005345781 A | 12/2005 |
| JP | 2006213833 A | 8/2006 |
| JP | 2006213834 A | 8/2006 |
| JP | 4311335 B2 | 8/2009 |
| JP | 4311336 B2 | 8/2009 |
| JP | 2010021422 A | 1/2010 |
| JP | 2012111719 A | 6/2012 |
| JP | 2016065956 A | 4/2016 |
| JP | 2016065973 A | 4/2016 |
| JP | 2016178240 A | 10/2016 |
| JP | 2018035172 A | 3/2018 |
| KR | 20000051826 A | 8/2000 |
| KR | 20140107594 A | 9/2014 |
| KR | 20160035448 A | 3/2016 |
| KR | 20160093531 A | 8/2016 |
| KR | 20160116219 A | 10/2016 |
| KR | 20160116220 A | 10/2016 |
| WO | 03012890 A2 | 8/2003 |
| WO | 2006043680 A1 | 4/2006 |
| WO | 2006043681 A1 | 4/2006 |
| WO | 2010098023 A1 | 9/2010 |
| WO | 2013098175 A1 | 7/2013 |
| WO | 2018113783 A1 | 6/2018 |

OTHER PUBLICATIONS

Liu MS, Niu YH, Ka JW, Yip HL, Huang F, Luo J, Kim TD, Jen AK. Thermally cross-linkable hole-transporting materials for improving hole injection in multilayer blue-emitting phosphorescent polymer light-emitting diodes. Macromolecules. Dec. 23, 2008;41(24):9570-80.
3 International Search Report for PCT/KR2019/014282 dated Feb. 11, 2020; 3 pages.

【FIG. 1】
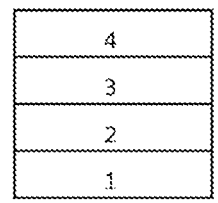
【FIG. 2】
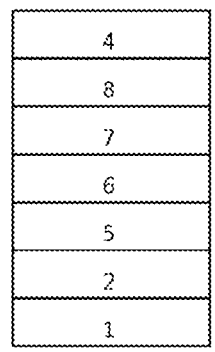

POLYMER AND ORGANIC LIGHT EMITTING DEVICE COMPRISING SAME

CROSS-REFERENCE TO RELATED APPLICATION(S)

This application is continuation-in-part of International Application No. PCT/KR2019/014282 filed Oct. 28, 2019, which claims priority from Korean Patent Application No. 10-2018-0139332 filed Nov. 13, 2018, all of which are incorporated herein by reference.

TECHNICAL FIELD

The present invention relates to a novel polymer and an organic light emitting device comprising the same.

BACKGROUND ART

In general, an organic light emitting phenomenon refers to a phenomenon where electric energy is converted into light energy by using an organic material. The organic light emitting device using the organic light emitting phenomenon has characteristics such as a wide viewing angle an excellent contrast, a fast response time, an excellent luminance, driving voltage and response speed, and thus many studies have proceeded.

The organic light emitting device generally has a structure which comprises an anode, a cathode, and an organic material layer interposed between the anode and the cathode. The organic material layer frequently has a multilayered structure that comprises different materials in order to enhance efficiency and stability of the organic light emitting device, and for example, the organic material layer may be formed of a hole injection layer, a hole transport layer, a light emitting layer, an electron transport layer, an electron injection layer and the like. In the structure of the organic light emitting device, if a voltage is applied between two electrodes, the holes are injected from an anode into the organic material layer and the electrons are injected from the cathode into the organic material layer, and when the injected holes and electrons meet each other, an exciton is formed, and light is emitted when the exciton falls to a ground state again.

There is a continuing need for the development of new materials for the organic materials used in the organic light emitting devices described above.

Meanwhile, recently, in order to reduce process costs, an organic light emitting device using a solution process, particularly an inkjet process, has been developed instead of a conventional deposition process. In the initial stage of development, attempts have been made to develop organic light emitting devices by coating all organic light emitting device layers by a solution process, but current technology has limitations. Therefore, only HIL, HTL, and EML are processed in a layer device structure by a solution process, and a hybrid process utilizing traditional deposition processes is being studied as a subsequent process.

Accordingly, the present invention provides a novel material for organic light emitting devices capable of being deposited by a solution process while being used for an organic light emitting device.

PRIOR ART LITERATURE

Patent Literature (Patent Literature 0001) Korean Patent Laid-open Publication No. 10-2000-0051826

DETAILED DESCRIPTION OF THE INVENTION

Technical Problem

It is an object of the present invention to provide a novel polymer and an organic light emitting device including the same.

Technical Solution

In one aspect of the invention, there is provided a polymer including a repeating unit represented by the following Chemical Formula 1.

[Chemical Formula 1]

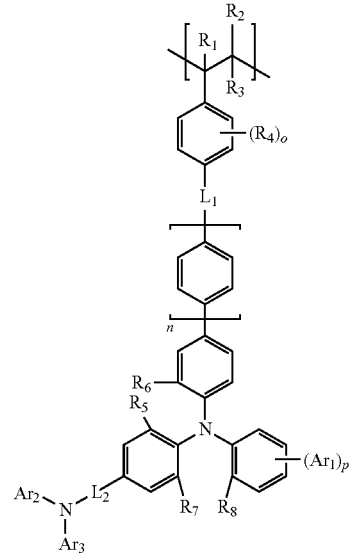

wherein, in Chemical Formula 1,
$L_1$ is $C_{2-10}$ alkylene, $C_{2-10}$ oxyalkylene, $C_{2-10}$ perfluoroalkylene or $C_{2-10}$ perfluorooxyalkylene,
$L_2$ is a single bond or a substituted or unsubstituted $C_{6-60}$ arylene,
each $Ar_1$ is independently hydrogen, $C_{1-10}$ alkyl, or a substituted or unsubstituted $C_{6-60}$ aryl,
$Ar_2$ and $Ar_3$ are each independently a substituted or unsubstituted $C_{6-60}$ aryl,
$R_1$, $R_2$ and $R_3$ are each independently hydrogen or $C_{1-10}$ alkyl,
each $R_4$ is independently hydrogen or halogen,
$R_5$ and $R_6$ are hydrogen or are linked together to form a single bond,
$R_7$ and $R_8$ are hydrogen or are linked together to form a single bond, with the proviso that the case where both $R_5$ and $R_6$, and $R_7$ and $R_8$ are linked together to form a single bond is excluded,
is an integer from 0 to 4,
p is an integer from 0 to 4, and
n is 0 or 1.

In another aspect of the present invention, there is provided an organic light emitting device including a first electrode; a second electrode that is disposed opposite to the first electrode; and one or more organic material layers that are disposed between the first electrode and the second electrode, wherein one or more layers of the organic material layers includes the above-mentioned polymer according to the present invention.

Advantageous Effects

The polymer represented by Chemical Formula can be used as a material a hole transport layer or a hole injection layer of an organic light emitting device, is capable of being deposited by a solution process, and can improve the efficiency, achieve low driving voltage and/or improve lifetime characteristics in the organic light emitting device.

BRIEF DESCRIPTION OF DRAWINGS

FIG. 1 shows an example an organic light emitting device comprising a substrate 1, an anode 2, a light emitting layer 3, and a cathode 4.

FIG. 2 shows an example of an organic light emitting device comprising a substrate 1, an anode 2, a hole injection layer 5, a hole transport layer 6, a light emitting layer 7, an electron transport layer 8, and a cathode 4.

DETAILED DESCRIPTION OF THE EMBODIMENTS

Hereinafter, embodiments of the present invention will be described in more detail to facilitate understanding of the invention.

As used herein, the notation ⌇ or | means a bond linked to another substituent group.

As used herein, the term "substituted or unsubstituted" means being unsubstituted or substituted with one or more substituents selected from the group consisting of deuterium; a halogen group; a nitrile group; a nitro group; a hydroxy group; a carbonyl group; an ester group; an imide group; an amino group; a phosphine oxide group; an alkoxy group; an aryloxy group; an alkylthioxy group; an arylthioxy group; an alkylsulfoxy group; an arylsulfoxy group; a silyl group; a boron group; an alkyl group; a cycloalkyl group; an alkenyl group; an aryl group; an aralkyl group; an aralkenyl group; an alkylaryl group; an alkylamine group; an aralkylamine group; a heteroarylamine group; an arylamine group; an arylphosphine group; and a heterocyclic group containing at least one of N, O and S atoms, or being unsubstituted or substituted with a substituent to which two or more substituents are linked among the substituents exemplified above. For example, "the substituent to which two or more substituents are linked" may be a biphenyl group. That is, the biphenyl group may be interpreted as an aryl group, or a substituent to which two phenyl groups are linked.

In the present specification, the number of carbon atoms of a carbonyl group is not particularly limited, but is preferably 1 to 40. Specifically, the carbonyl group may be a compound having the following structural formulae, but is not limited thereto.

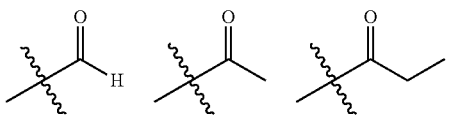

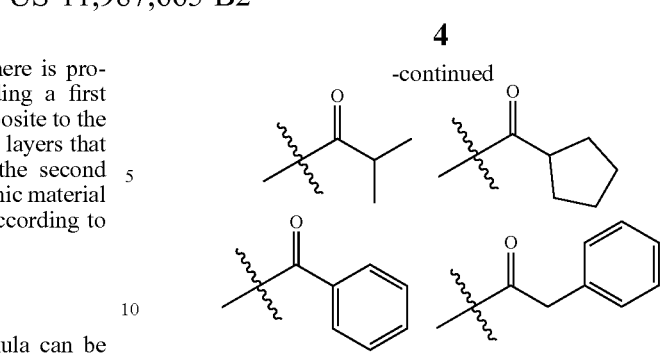

In the present specification, an ester group may have a structure in which oxygen of the ester group may be substituted by a straight-chain, branched-chain, or cyclic alkyl group having 1 to 25 carbon atoms, or an aryl group having 6 to 25 carbon atoms. Specifically, the ester group may be a compound having the following structural formulae, but is not limited thereto.

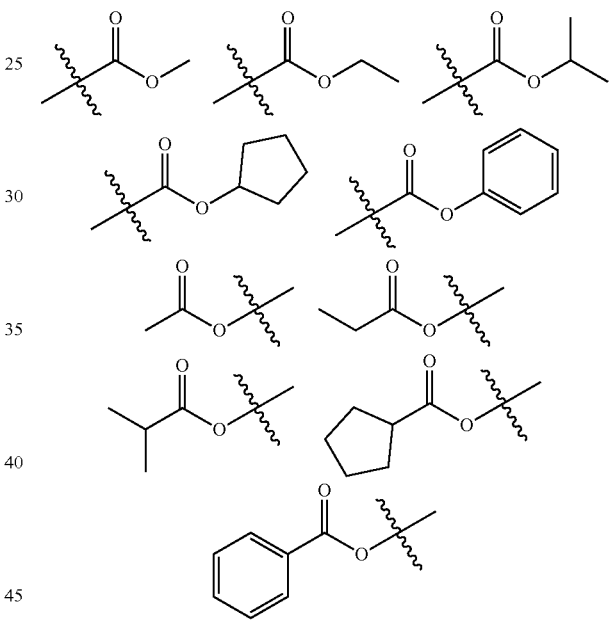

In the present specification, the number of carbon atoms of an imide group is not particularly limited, but is preferably 1 to 25. Specifically, the imide group may be a compound having the following structural formulae, but is not limited thereto.

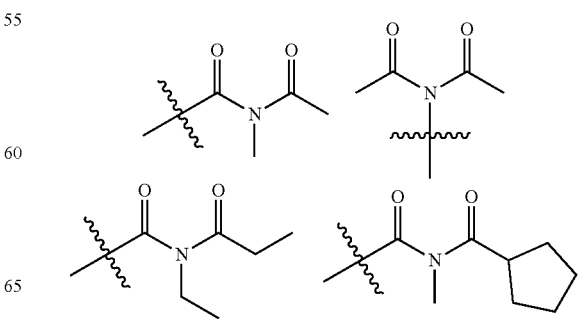

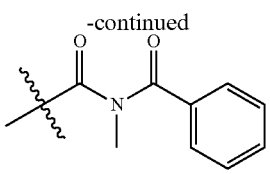

In the present specification, a silyl group specifically includes a trimethylsilyl group, a triethylsilyl group, a t-butyldimethylsilyl group, a vinyldimethylsilyl group, a propyldimethylsilyl group, a triphenylsilyl group, a diphenylsilyl group, a phenylsilyl group and the like, but is not limited thereto.

In the present specification, a boron group specifically includes a trimethylboron group, a triethylboron group, a t-butyldimethylboron group, a triphenylboron group, and a phenylboron group, but is not limited thereto.

In the present specification, examples of a halogen group include fluorine, chlorine, bromine, or iodine.

In the present specification, the alkyl group may be a straight chain or branched chain, and the number of carbon atoms thereof is not particularly limited, but is preferably 1 to 40. According to one embodiment, the number of carbon atoms of the alkyl group is 1 to 20. According to another embodiment, the number of carbon atoms of the alkyl group is 1 to 10. According to another embodiment, the number of carbon atoms of the alkyl group is 1 to 6. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 4-methyl-2-pentyl, 3,3-dimethylbutyl, 2-ethylbutyl, heptyl, n-heptyl, 1-methylhexyl, cyclopentylmethyl, cyclohectylmethyl, octyl, n-octyl, tert-octyl, 1-methylheptyl, 2-ethylhexyl, 2-propylpentyl, n-nonyl, 2,2-dimethylheptyl, 1-ethylpropyl, 1,1-dimethyl-propyl, isohexyl, 2-methylpentyl, 4-methylhexyl, 5-methylhexyl, and the like, but are not limited thereto.

In the present specification, the alkenyl group may be a straight chain or branched chain, and the number of carbon atoms thereof is not particularly limited, but is preferably 2 to 40. According to one embodiment, the number of carbon atoms of the alkenyl group is 2 to 20. According to another embodiment, the number of carbon atoms of the alkenyl group is 2 to 10. According to still another embodiment, the number of carbon atoms of the alkenyl group is 2 to 6. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenylvinyl-1-yl, 2-phenylvinyl-1-yl, 2,2-diphenylvinyl-1-yl, 2-phenyl-2-(naphthyl-1-yl)vinyl-1-yl, 2,2-bis(diphenyl-1-yl)vinyl-1-yl, a stilbenyl group, a styrenyl group, and the like, but are not limited thereto.

In the present specification, a cycloalkyl group is not particularly limited, but the number of carbon atoms thereof is preferably 3 to 60. According to one embodiment, the number of carbon atoms of the cycloalkyl group is 3 to 30. According to another embodiment, the number of carbon atoms of the cycloalkyl group is 3 to 20. According to still another embodiment, the number of carbon atoms of the cycloalkyl group is 3 to 6. Specific examples thereof include cyclopropyl, cyclobutyl, cyclopentyl, 3-methylcyclopentyl, 2,3-dimethylcyclopentyl, cyclohexyl, 3-methylcyclohexyl, 4-methylcyclohexyl, 2,3-dimethylcyclohexyl, 3,4,5-trimethylcyclohexyl, 4-tert-butylcyclohexyl, cycloheptyl, cyclooctyl, and the like, but are not limited thereto.

In the present specification, an aryl group is not particularly limited, but preferably has 6 to 60 carbon atoms, and may be a monocyclic aryl group or a polycyclic aryl group. According to one embodiment, the number of carbon atoms of the aryl group is 6 to 30. According to one embodiment, the number of carbon atoms of the aryl group is 6 to 20. The aryl group may be a phenyl group, a biphenyl group, a terphenyl group or the like as the monocyclic aryl group, but is not limited thereto. Examples of the polycyclic aryl group include a naphthyl group, an anthracenyl group, a phenanthryl group, a pyrenyl group, a perylenyl group, a chrysenyl group, a fluorenyl group, or the like, but is not limited thereto.

In the present specification, a fluorenyl group may be substituted, and two substituent groups may be linked to each other to form a spiro structure. In the case where the fluorenyl group is substituted,

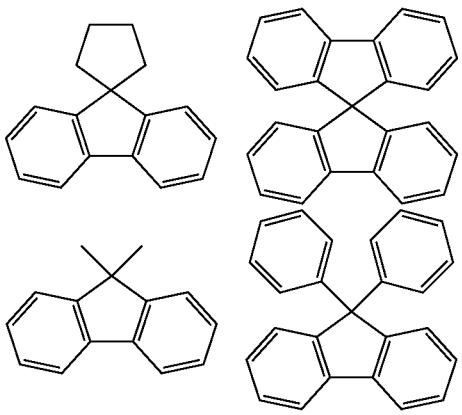

and the like can be formed. However, the structure is not limited thereto.

In the present specification, a heterocyclic group is a heterocyclic group including one or more of O, N, Si and S as a heteroatom, and the number of carbon atoms thereof is not particularly limited, but is preferably 2 to 60. Examples of the heterocyclic group include a thiophene group, a furan group, a pyrrole group, an imidazole group, a thiazole group, an oxazol group, an oxadiazol group, a triazol group, a pyridyl group, a bipyridyl group, a pyrimidyl group, a triazine group, a triazole group, an acridyl group, a pyridazine group, a pyrazinyl group, a quinolinyl group, a quinazoline group, a quinoxalinyl group, a phthalazinyl group, a pyridopyrimidinyl group, a pyridopyrazinyl group, a pyrazinopyrazinyl group, an isoquinoline group, an indole group, a carbazole group, a benzoxazole group, a benzimidazole group, a benzothiazol group, a benzocarbazole group, a benzothiophene group, a dibenzothiophene group, a benzofuranyl group, a phenanthroline group, a thiazolyl group, an isoxazolyl group, an oxadiazolyl group, a thiadiazolyl group, a benzothiazolyl group, a phenothiazinyl group, a dibenzofuranyl group, and the like, but are not limited thereto.

In the present specification, the aryl group in the aralkyl group, the aralkenyl group, the alkylaryl group, and the arylamine group is the same as the aforementioned examples of the aryl group. In the present specification, the alkyl group in the aralkyl group, the alkylaryl group and the alkylamine group is the same as the aforementioned examples of the alkyl group. In the present specification, the heteroaryl in the heteroarylamine can be applied to the aforementioned description of the heterocyclic group. In the present specification, the alkenyl group in the aralkenyl group is the same as the aforementioned examples of the alkenyl group. In the present specification, the aforementioned description of the aryl group may be applied except that the arylene is a divalent group. In the present specification, the aforementioned description of the heterocyclic group can be applied except that the heteroarylene is a divalent group. In the present specification, the aforementioned description of the aryl group or cycloalkyl group can be applied except that the hydrocarbon ring is not a monovalent group but formed by combining two substituent groups. In the present specification, the aforementioned description of the heterocyclic group can be applied, except that the heterocycle is not a monovalent group but formed by combining two substituent groups.

The arylamine-based materials for solution process used in the prior art had a problem that it is difficult to simultaneous y secure solubility in solvents and hole transport characteristics.

However, the polymer according to the present invention includes an appropriate linker (L 1) structure between the main chain and the arylamine-based core in the repeating unit represented by Chemical Formula 1. Thereby, the steric hindrance with the core can be reduced to achieve sufficient solubility in solution process together with excellent hole transfer properties. This will be described in more detail below.

One embodiment of the present invention provides a polymer including a repeating unit represented by the following Chemical Formula 1:

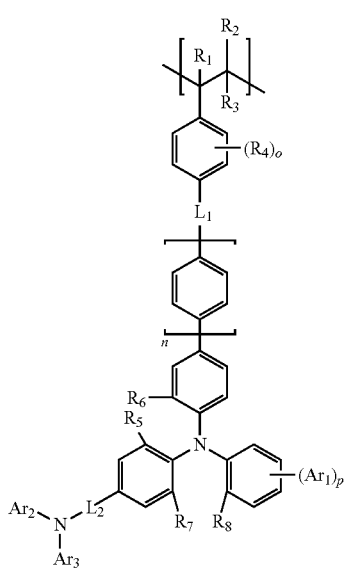

[Chemical Formula 1]

wherein, in Chemical Formula 1, $L_1$ is $C_{2-10}$ alkylene, $C_{2-10}$ oxyalkylene, $C_{2-10}$ perfluoroalkylene or $C_{2-10}$ perfluorooxyalkylene, $L_2$ is a single bond or a substituted or unsubstituted $C_{6-60}$ arylene, each $Ar_1$ is independently hydrogen, $C_{1-10}$ alkyl, or a substituted or unsubstituted $C_{6-60}$ aryl, $Ar_2$ and $Ar_3$ are each independently a substituted or unsubstituted $C_{6-60}$ aryl, $R_1$, $R_2$ and $R_3$ are each independently hydrogen or $C_{1-10}$ alkyl, each $R_4$ is independently hydrogen or halogen, $R_5$ and $R_6$ are hydrogen or are linked together to form a single bond, $R_7$ and $R_8$ are hydrogen or are linked together to form a single bond, with the proviso that the case where both $R_5$ and $R_6$, and $R_7$ and $R_8$ are linked together to form a single bond is excluded, is an integer from 0 to 4, p is an integer from 0 to 4, and n is 0 or 1.

Preferably, the repeating unit represented by Chemical Formula 1 may be any one selected from repeating units represented by the following Chemical Formulas 2 to 4:

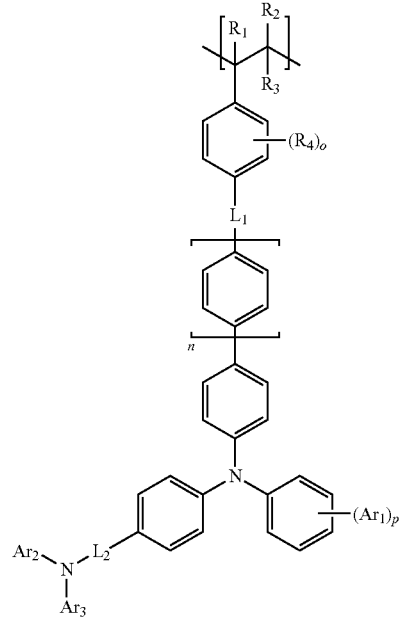

[Chemical Formula 2]

-continued

[Chemical Formula 3]

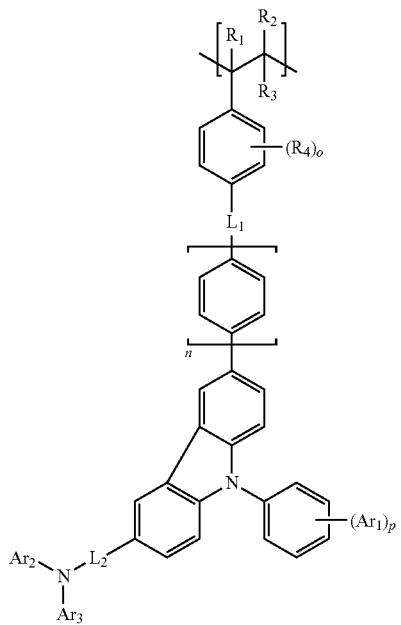

[Chemical Formula 4]

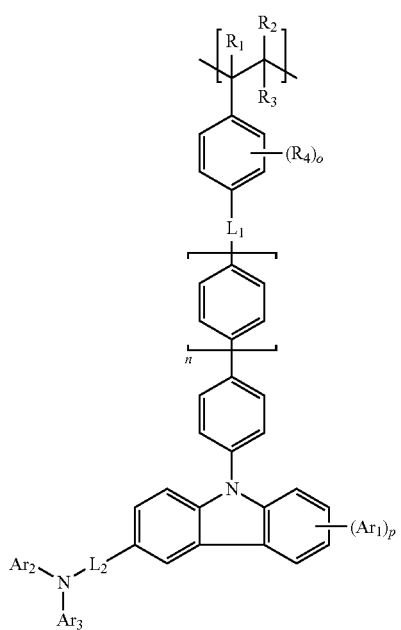

wherein, $L_1$, $L_2$, $Ar_1$, $Ar_2$, $Ar_3$, $R_1$, $R_2$, $R_3$, $R_4$, o, p and n are as defined in Chemical Formula 1.

Preferably, the $L_1$ may be —$C_4H_8$—, —$C_5H_{10}$—, —$C_6H_{12}$—, —$OC_4H_8$—, —$OC_5H_{10}$—, —$OC_6H_{12}$—, —$(OC_2H_4)_2$—, —$(OC_2H_4)_3$—, —$O(C_2H_4)O(C_3H_6)O(C_2H_4)$—, —$C_4F_8$—, —$C_5F_{10}$—, —$C_6F_{12}$—, —$OC_4F_8$—, —$OC_5F_{10}$—, —$OC_6F_{12}$—, —$(OC_2F_4)_2$— or —$(OC_2F_4)_3$—.

In addition, $L_1$ may be —$(CH_2)_4$—, —$(CH_2)_5$—, —$(CH_2)_6$—, —$O(CH_2)_4$—, —$O(CH_2)_5$—, —$O(CH_2)_6$—, —$(O(CH_2)_2)_2$—, —$(O(CH_2)_2)_3$—, —$O(CH_2)_2O(CH_2)_3O(CH_2)_2$—, —$(CF_2)_4$—, —$(CF_2)_5$—, —$(CF_2)_6$—, —$O(CF_2)_4$—, —$O(CF_2)_5$—, —$O(CF_2)_6$—, —$(O(CF_2)_2)_2$—, —$(O(CF_2)_2)_3$—.

Preferably, the $L_2$ may be a single bond, phenylene, or biphenylylene.

Preferably, the $Ar_1$ may be each independently hydrogen, methyl, or phenyl.

Preferably, the $Ar_2$ and $Ar_3$ may be each independently phenyl, biphenylyl, dimethylfluorenyl, or diphenylfluorenyl, and the $Ar_2$ and $Ar_3$ may be unsubstituted or substituted with methyl, ethyl, propyl, isopropyl, butyl, isobutyl or tertbutyl.

Preferably, the $R_1$, $R_2$ and $R_3$ may be each independently hydrogen or methyl.

Preferably, the $R_4$ may be hydrogen or fluoro.

Preferably, the Chemical Formula 1 is any one selected from the group consisting of repeating units represented by the following:

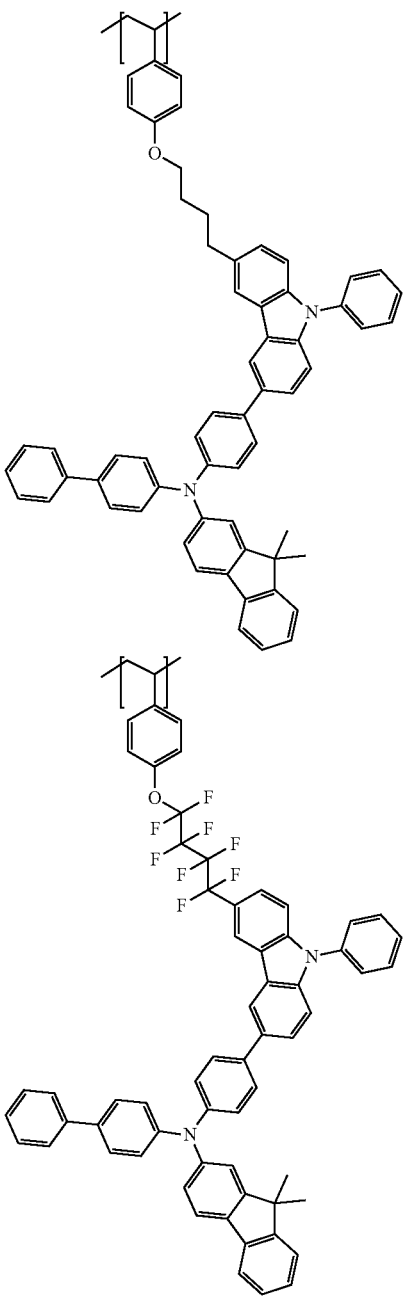

11
-continued
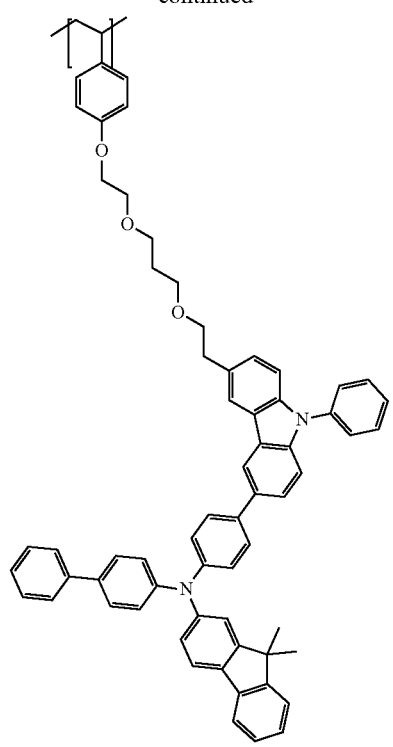
12
-continued
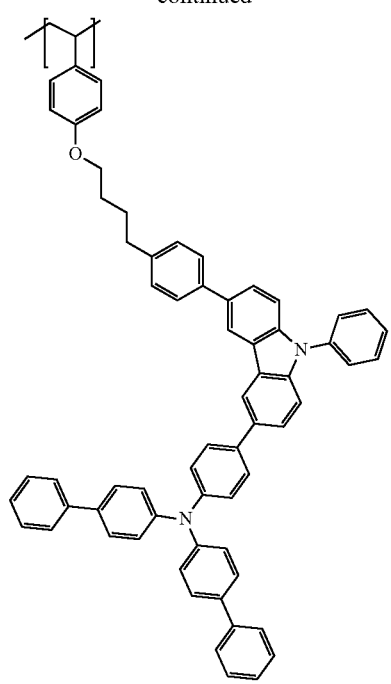
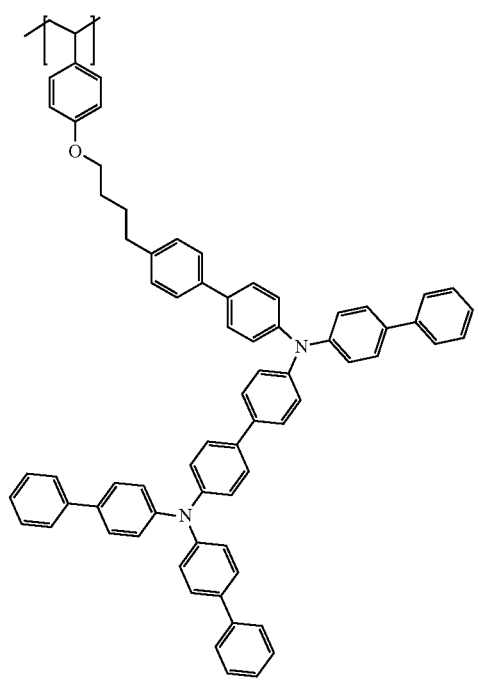
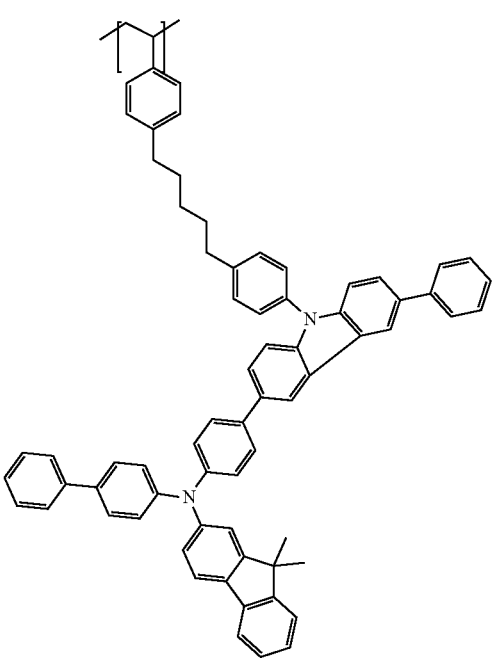

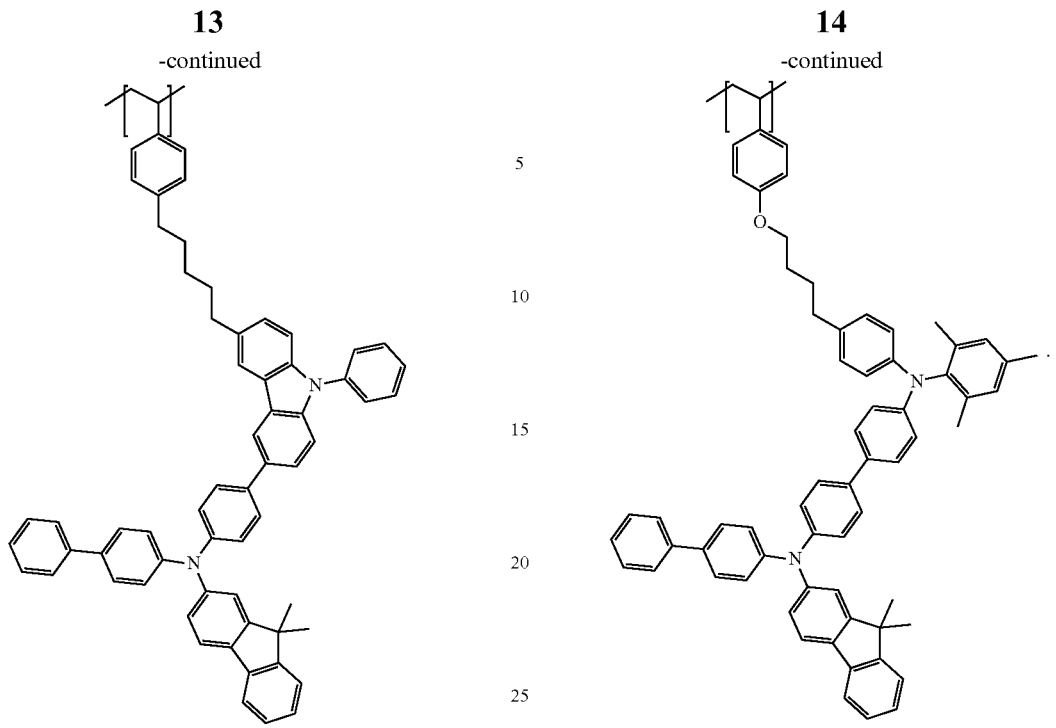

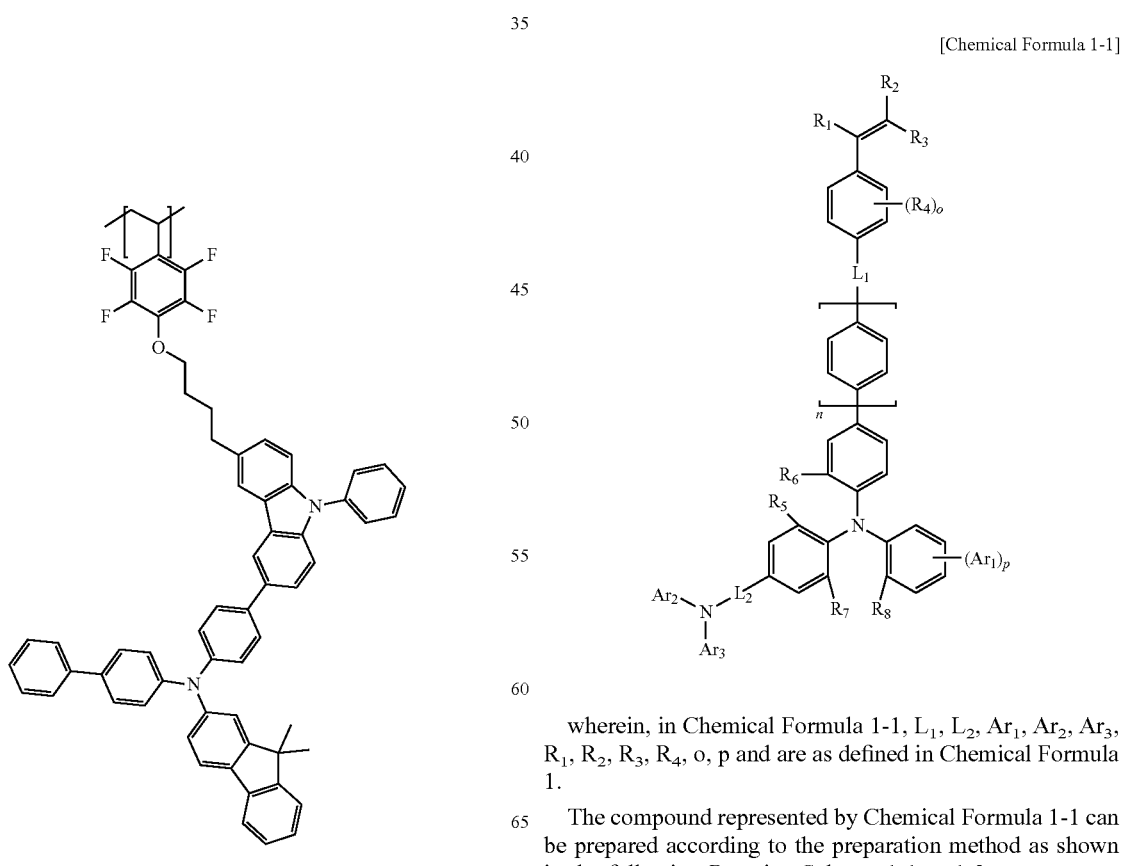

Meanwhile, the compound represented by Chemical Formula 1 is derived from a monomer represented by the following Chemical Formula 1-1:

[Chemical Formula 1-1]

wherein, in Chemical Formula 1-1, $L_1$, $L_2$, $Ar_1$, $Ar_2$, $Ar_3$, $R_1$, $R_2$, $R_3$, $R_4$, o, p and are as defined in Chemical Formula 1.

The compound represented by Chemical Formula 1-1 can be prepared according to the preparation method as shown in the following Reaction Scheme 1-1 or 1-2.

[Reaction Scheme 1-1]

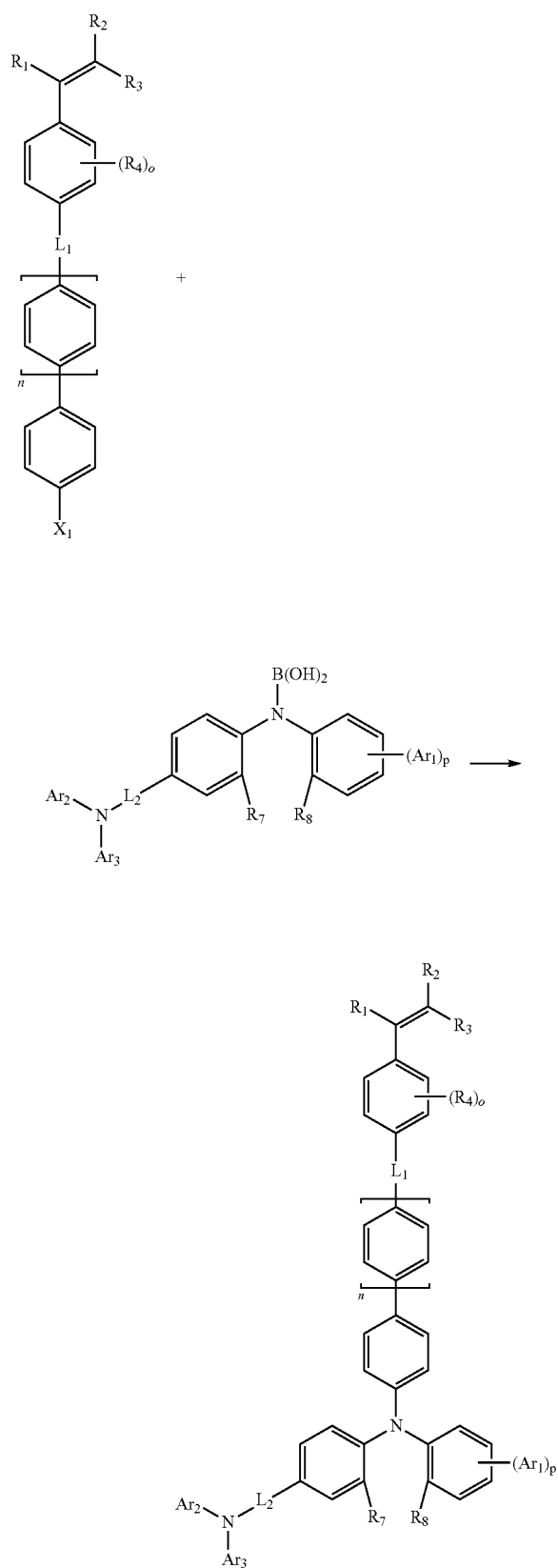

[Reaction Scheme 1-2]

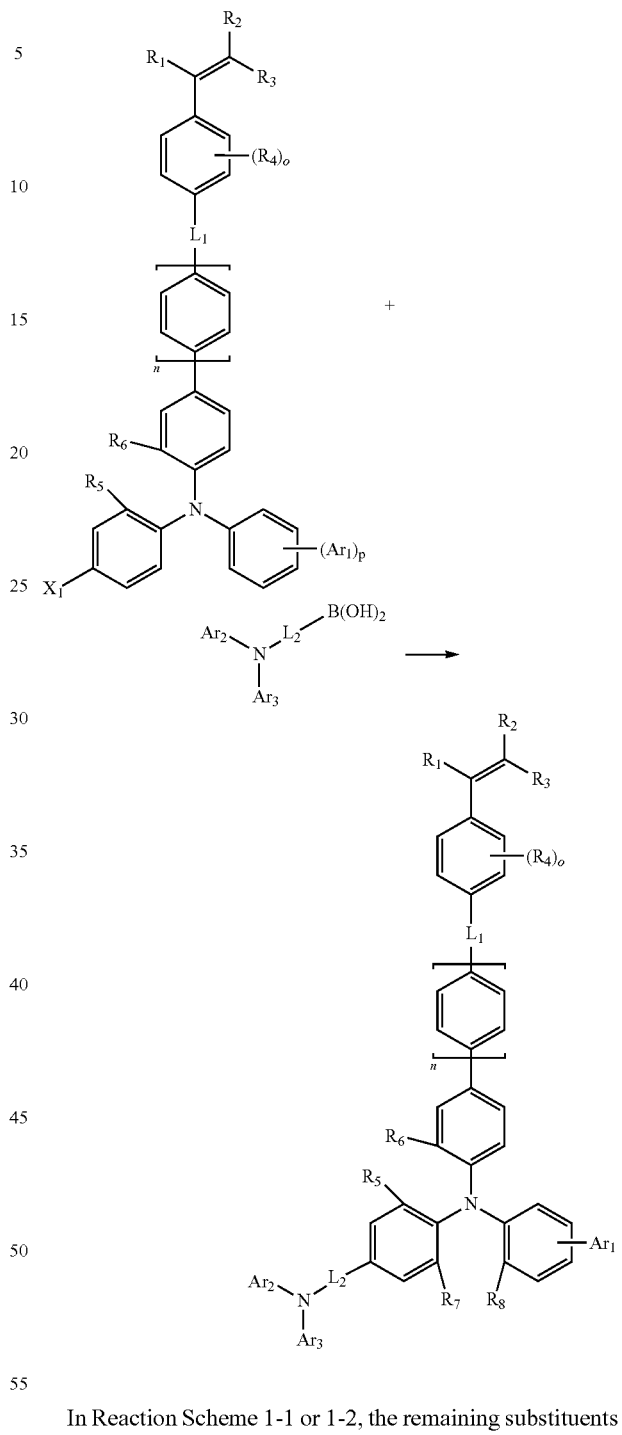

In Reaction Scheme 1-1 or 1-2, the remaining substituents excluding $X_1$ are as defined above, and $X_1$ is halogen, preferably bromo, or chloro. The Reaction Schemes 1-1 and 1-2 are amine substitution reactions, which reactions are carried out in the presence of a palladium catalyst and a base to produce a compound represented by Chemical Formula 1-1. The above preparation method can be further embodied in Preparation Examples described hereinafter.

The polymer according to the present invention may be prepared by polymerizing the monomer represented by Chemical Formula 1-1 described above. Preferably, the polymer according to the present invention is a copolymer including the repeating unit represented by Chemical Formula 1.

Preferably, the weight average molecular weight of the polymer is 5,000 to 500,000, and more preferably 10,000 to 300,000.

(Coating Composition)

The compound according to the present invention can form an organic material layer, particularly a hole transport layer or a hole injection layer, of the organic light emitting device by a solution process. To this end, one embodiment of the present invention provides a coating composition including the above-mentioned compound according to the present invention and a solvent.

The solvent is not particularly limited as long as it is a solvent capable of dissolving or dispersing the compound according to the present invention. As one example, there may be mentioned chlorine-based solvents such as chloroform, methylene chloride, 1,2-dichloroethane, 1,1,2-trichloroethane, chlorobenzene and o-dichlorobenzene; ether-based solvents such as tetrahydrofuran and dioxane; aromatic hydrocarbon-based solvents such as toluene, xylene, trimethylbenzene and mesitylene; aliphatic hydrocarbon-based solvents such as cyclohexane, methylcyclohexane, n-pentane, n-hexane, n-heptane, n-octane, n-nonane and n-decane; ketone-based solvents such as acetone, methyl ethyl ketone, and cyclohexanone; ester-based solvents such as ethyl acetate, butyl acetate and ethyl cellosolve acetate; polyalcohols such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerin and 1,2-hexanediol, and derivatives thereof; alcohol-based solvents such as methanol, ethanol, propanol, isopropanol and cyclohexanol; sulfoxide-based solvents such as dimethyl sulfoxide; amide-based solvents such as N-methyl-2-pyrrolidone and N,N-dimethylformamide; benzoate-based solvents such as butyl benzoate and methyl-2-methoxybenzoate; tetraline; 3-phenoxy-toluene, and the like. In addition, the above-mentioned solvents may be used singly or in combination of two or more solvents.

Further, the viscosity of the coating composition is preferably 1 cP to 10 cP, and coating is easy within the above range. Further, in the coating composition, the concentration of the compound according to the present invention is preferably 0.1 wt/v % to 20 wt/v %.

In addition, the coating composition may further include one or more additives selected from the group consisting of a thermal polymerization initiator and a photopolymerization initiator.

Examples of the thermal polymerization initiator may include peroxides such as methyl ethyl ketone peroxide, methyl isobutyl ketone peroxide, acetyl acetone peroxide, methyl cyclohexanone peroxide, cyclohexanone peroxide, isobutyryl peroxide, 2,4-dichlorobenzoyl peroxide, bis-3,5, 5-trimethylhexanoyl peroxide, lauryl peroxide, benzoyl peroxide, or azo-based such as azobis isobutylnitrile, azobis dimethylvaleronitrile and azobis cyclohexylnitrile, but are not limited thereto.

Examples of the photopolymerization initiator may include acetophenone-based or ketal-based photopolymerization initiators such as diethoxyacetophenone, 2,2-dimethoxy-1,2-diphenylethan-1-one, 1-hydroxy-cyclohexyl-phenyl-ketone, 4-(2-hydroxyethoxy)phenyl-(2-hydroxy-2-propyl)ketone, 2-benzyl-2-dimethylamino-1-(4-morpholinophenyl)butanone-1,2-hydroxy-2-methyl-1-phenylpropan-1-one, 2-methyl-2-morpholino(4-methylthiophenyl)propan-1-one and 1-phenyl-1,2-propanedion-2-(o-ethoxycarbonyl)oxime; benzoin ether-based photopolymerization initiators such as benzoin, benzoin methyl ether and benzoin ethyl ether; benzophenone-based photopolymerization initiators such as benzophenone, 4-hydroxybenzophenone, 2-benzoyl naphthalene, 4-benzoylbiphenyl and 4-benzoylphenyl ether; thioxanthone-based photopolymerization initiators such as 2-isopropylthioxanthone, 2-chlorothioxanthone, 2,4-dimethylthioxanthone, 2,4-diethylthioxanthone and 2,4-dichlorothioxanthone; and other photopolymerization initiators such as ethyl anthraquinone, 2,4,6-trimethylbenzoyl diphenylphosphine oxide, 2,4,6-trimethylbenzoyl phenylethoxyphosphine oxide, bis(2,4,6-trimethylbenzoyl)phenylphosphine oxide, and bis(2,4-dimethoxy benzoyl)-2,4,4-trimethylpentylphosphine oxide, but are not limited thereto.

In addition, those having a photopolymerization accelerating effect may be used either alone or as a combination with the photopolymerization initiator. Examples thereof may include triethanolamine, methyldiethanolamine, ethyl 4-dimethylaminobenzoate, isoamyl 4-dimethylaminobenzoate, (2-dimethylamino)ethyl benzoate, 4,4'-dimethylaminobenzophenone and the like, but are not limited thereto.

In another embodiment of the invention, there is provided a method for forming a hole injection layer or a hole transport layer using the above-mentioned coating composition. Specifically, the method includes the steps of: coating the above-mentioned coating composition according to the present invention on the anode or on the light emitting layer formed on the anode by a solution process; and heat treating or light treating the coated coating composition.

The solution process uses the above-mentioned coating composition according to the present invention, and refers to spin coating, dip coating, doctor blading, inkjet printing, screen printing, spray method, roll coating, and the like, but is not limited thereto.

The heat treatment temperature in the heat treatment is preferably from 150 to 230° C. In another embodiment, a heat treatment time may be from 1 minute to 3 hours, more preferably 10 minutes to 1 hour. In another embodiment, the heat treatment is preferably carried out in an inert gas atmosphere such as argon and nitrogen. Further, the method may further include a step of evaporating the solvent between the coating step and the heat treatment or light treatment step.

(Organic Light Emitting Device)

In another aspect of the invention, there is provided an organic light emitting device including the above-mentioned polymer according to the present invention. Specifically, the present invention provides an organic light emitting device including a first electrode; a second electrode that is disposed opposite to the first electrode; and one or more organic material layers that are disposed between the first electrode and the second electrode, wherein one or more layers of the organic material layers includes the polymer according to the present invention.

Preferably, the polymer may be included in the hole transport layer or the hole injection layer of the organic material layer.

The structure of an organic light emitting device according to an embodiment of the present invention is illustrated in FIGS. 1 and 2.

FIG. 1 shows an example of an organic light emitting device comprising a substrate 1, an anode 2, a hole transport layer 3, a light emitting layer 4, and a cathode 5. FIG. 2 shows an example of an organic light emitting device comprising a substrate 1, an anode 2, a hole injection layer 5, a hole transport layer 6, a light emitting layer electron transport layer 8, and a cathode 4.

The organic light emitting device according to the present invention may be manufactured by materials and methods known in the art, except that the hole transport layer or the hole injection layer includes the polymer according to the present invention and is manufactured according to the above-mentioned method.

For example, the organic light emitting device according to the present invention can be manufactured by sequentially stacking an anode, an organic material layer and a cathode on a substrate. In this case, the organic light emitting device may be manufactured by depositing a metal, metal oxides having conductivity, or an alloy thereof on the substrate using a PVD (physical vapor deposition) method such as a sputtering method or an e-beam evaporation method to form an anode, forming organic material layers including the hole injection layer, the hole transport layer, the light emitting layer and the electron transport layer thereon, and then depositing a material that can be used as the cathode thereon.

In addition to such a method, the organic light emitting device may be manufactured by sequentially depositing a cathode material, an organic material layer and an anode material on substrate (International Publication WO2003/012890). However, the manufacturing method is not limited thereto.

As the anode material, generally, a material having a large work function is preferably used so that holes can be smoothly injected into the organic material layer. Specific examples of the anode material include metals such as vanadium, chrome, copper, zinc, and gold, or an alloy thereof; metal oxides such as zinc oxides, indium oxides, indium tin oxides (ITO), and indium zinc oxides (IZO); a combination of metals and oxides, such as ZnO:Al or $SnO_2$:Sb; conductive polymers such as poly(3-methylthiophene), poly[3,4-(ethylene-1,2-dioxy)thiophene](PEDOT), polypyrrole, and polyaniline, and the like, but are not limited thereto.

As the cathode material, generally, a material having a small work function is preferably used so that electrons can be easily injected into the organic material layer. Specific examples of the cathode material include metals such as magnesium, calcium, sodium, potassium, titanium, indium, yttrium, lithium, gadolinium, aluminum, silver, tin, and lead, or an alloy thereof; a multilayered structure material such as LiF/Al or $LiO_2$/Al, and the like, but are not limited thereto.

The hole injection layer is a layer for injecting holes from the electrode, and the hole injection material is preferably a compound which has a capability of transporting the holes, thus has a hole injecting effect in the anode and an excellent hole injecting effect to the light emitting layer or the light emitting material, prevents excitons produced in the light emitting layer from moving to an electron injection layer or the electron injection material, and further is excellent in the ability to form a thin film. It is preferable to use the hole injection material that has a HOMO (highest occupied molecular orbital) between the work function of the anode material and a HOMO of a peripheral organic material layer. Specific examples of the hole injection material include metal porphyrine, oligothiophene, an arylamine-based organic material, a hexanitrilehexaazatriphenylene-based organic material, a quinacridone-based organic material, a perylene-based organic material, anthraquinone, polyaniline and polythiophene-based conductive polymer, and the like, but are not limited thereto.

The light emitting material is preferably a material which may receive holes and electrons transported from a hole transport layer and an electron transport layer, respectively, and combine the holes and the electrons to emit light in a visible ray region, and has good quantum efficiency to fluorescence or phosphorescence. Specific examples of the light emitting material include an 8-hydroxyquinoline aluminum complex ($Alq_3$); a carbazole-based compound; a dimerized styryl compound; BAlq; a 10-hydroxybenzoquinoline-metal compound; a benzoxazole, benzthiazole and benzimidazole-based compound; a poly(p-phenylenevinylene) (PPV)-based polymer; a spiro compound; polyfluorene, rubrene, and the like, but are not limited thereto.

The light emitting layer may include a host material and a dopant material. The host material may be a fused aromatic ring derivative, a heterocycle-containing compound or the like. Specific examples of the fused aromatic ring derivatives include anthracene derivatives, pyrene derivatives, naphthalene derivatives, pentacene derivatives, phenanthrene compounds, fluoranthene compounds, and the like. Examples of the heterocycle-containing compounds include carbazole derivatives, dibenzofuran derivatives, ladder-type furan compounds, pyrimidine derivatives, and the like, but are not limited thereto. The dopant material includes an aromatic amine derivative, a styrylamine compound, a boron complex, a fluoranthene compound, a metal complex, and the like. Specifically, the aromatic amine derivative is a substituted or unsubstituted fused aromatic ring derivative having an arylamino group, and examples thereof include pyrene, anthracene, chrysene, periflanthene and the like, which have an arylamino group. The styrylamine compound is a compound where at least one arylvinyl group is substituted in substituted or unsubstituted arylamine, in which one or two or more substituent groups selected from the group consisting of an aryl group, a silyl group, an alkyl group, a cycloalkyl group, and an arylamino group are substituted or unsubstituted. Specific examples thereof include styrylamine, styryldiamine, styryltriamine, styryltetramine, and the like, but are not limited thereto. Further, the metal complex includes an iridium complex, a platinum complex, and the like, but is not limited thereto.

The electron transport layer is a layer which receives electrons from an electron injection layer and transports the electrons to a light emitting layer, and an electron transport material is suitably a material which may receive electrons well from a cathode and transfer the electrons to a light emitting layer, and has a large mobility for electrons. Specific examples of the electron transport material include: an Al complex of 8-hydroxyquinoline; a complex including $Alq_3$; an organic radical compound; a hydroxyflavone-metal complex, and the like, but are not limited thereto. The electron transport layer may be used with any desired cathode material, as used according to the related art. In particular, appropriate examples of the cathode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode, and is preferably a compound which has a capability of transporting electrons, has an effect of injecting electrons from a cathode and an excellent effect of injecting electrons into a light emitting layer or a light emitting material, prevents excitons produced from the light emitting layer from moving to a hole injection layer, and is also excellent in the ability to form a thin film. Specific examples of the electron injection layer include fluorenone, anthraquinodimethane, diphenoquinone, thiopyran dioxide, oxazole, oxadiazole, triazole, imidazole, perylenetetracarboxylic acid, fluorenylidene methane, anthrone, and the like, and derivatives thereof, a metal complex compound, a nitrogen-containing 5-membered ring derivative, and the like, but are not limited thereto.

The metal complex compound includes 8-hydroxyquinolinato lithium, bis(8-hydroxyquinolinato)zinc, bis(8-hydroxyquinolinato) copper, bis(8-hydroxyquinolinato)manganese, tris(8-hydroxyquinolinato)aluminum, tris(2-methyl-8-hydroxyquinolinato)aluminum, tris(8-hydroxyquinolinato)gallium, bis(10-hydroxybenzo[h]quinolinato)beryllium, bis(10-hydroxybenzo[h]quinolinato)zinc, bis(2-methyl-8-quinolinato)chlorogallium, bis(2-methyl-8-quinolinato)(o-cresolato)gallium, bis(2-methyl-8-quinolinato)(1-naphtholato)aluminum, bis(2-methyl-8-quinolinato)(2-naphtholato)gallium, and the like, but are not limited thereto.

The organic light emitting device according to the present invention may be a front side emission type, a back side emission type, or a double side emission type according to the used material.

In addition, the compound according to the present invention may be included in an organic solar cell or an organic transistor in addition to an organic light emitting device.

The preparation of the polymer including a repeating unit represented by Chemical Formula 1 and the organic light emitting device containing the same will be described in detail in the following examples. However, these examples are presented for illustrative purposes only, and are not intended to limit the scope of the present invention.

EXAMPLE

Example 1: Preparation of Polymer Compound 1

[Reaction Scheme 1-1]

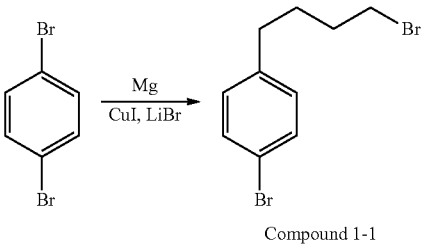

Compound 1-1

In a 500 mL, round-bottom flask under nitrogen atmosphere, Mg (2.06 q, 84.78 mmol) was added and tetrahydrofuran (THF) (50 mL) was added, and the mixture was stirred for 30 minutes. The flask was then placed in a 0° C. bath and stirred for 30 minutes. 1,4-Dibromobenzene (20 g, 84.74 mmol) was dissolved in 50 ml of THF and slowly added to the flask. After completion of the addition, a small amount of iodine ($I_2$) was added and stirred at room temperature for 15 hours. It was confirmed that the reaction solution turned black and Mg was dissolved. After preparing a Grignard solution, CuI (0.323 g, 1.696 mmol) and LiBr (0.295 g, 3.391 mmol) were added to another 500 ml round-bottom flask, and 5 ml of THF was added and dissolved. Dibromobutane (36.61 g, 169.6 mmol) and 50 ml of THF were then added to the flask. The flask was then placed in a 0° C. bath and stirred for 30 minutes. The previously prepared Grignard solution was slowly added to the flask. After completion of the addition, the temperature was raised to room temperature and stirred for one day. After completion of the reaction, 200 ml of a 5 wt % $NH_4Cl$ solution was slowly added. Organic solvent was extracted using EA (50 mL×3) and the remaining water was removed with $MgSO_4$. The organic layer was recovered and then concentrated. The concentrated liquid was purified by vacuum distillation, and Compound 1-1 could be separated and recovered at a vapor temperature of 140° C. and 4 Torr (yield: 35%).

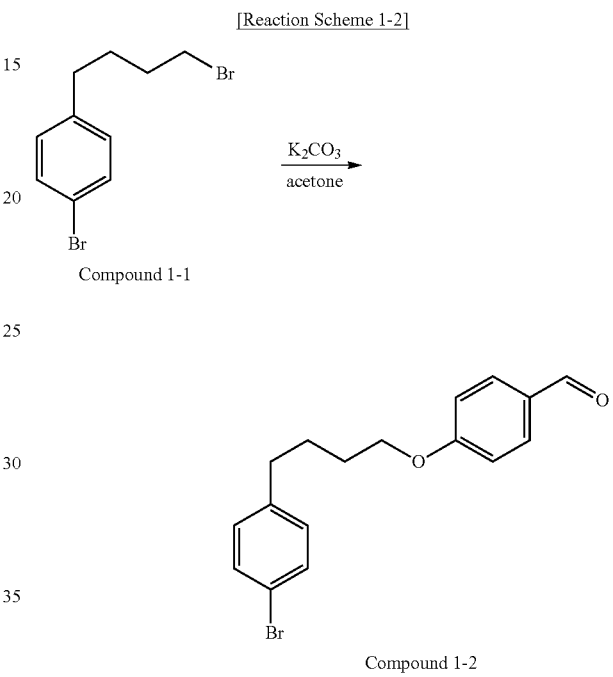

The previously synthesized Compound 1-1 (1-bromo-4-(4-bromobutyl)benzene) (4 g, 13.96 mmol), 4-hydroxybenzaldehyde (2 g, 16.44 mmol) and $K_2CO_3$ (3.78 g, 27.38 mmol) were added to a 250 mL round-bottom flask under nitrogen atmosphere, and dissolved in 45 ml of acetone. The reaction mixture was heated to 70° C. and stirred for 4 hours. Subsequently, materials were extracted from brine/EA. Column purification was performed while gradually changing the solvent ratio to Hex:MC (9:1 to 4:6). The resultant product was then concentrated to obtain 3.5 g of a pale yellow liquid (Compound 1-2) (yield: 81%).

[Reaction Scheme 1-3]

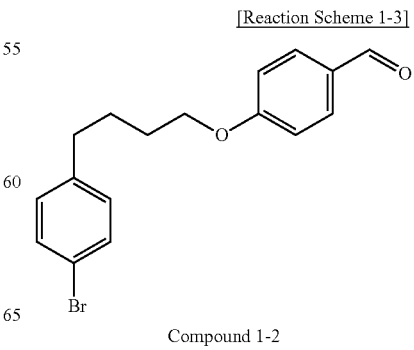

Compound 1-2

-continued

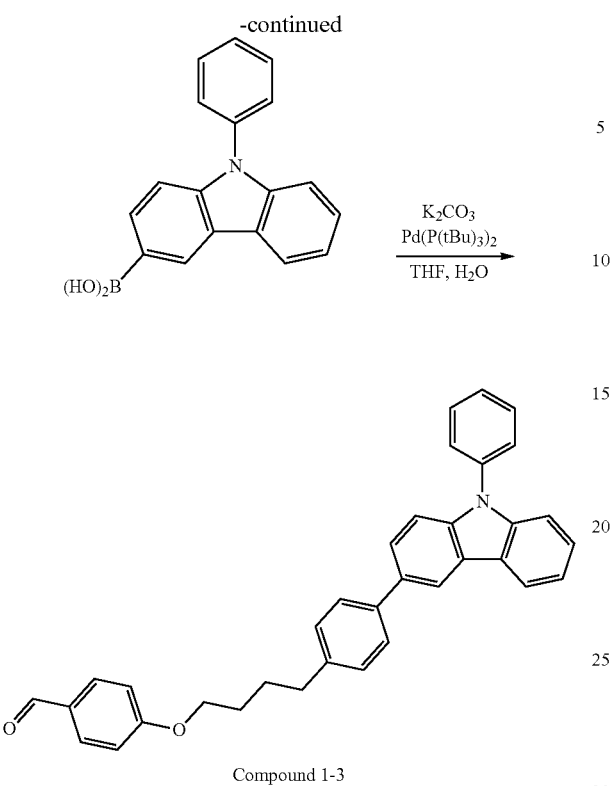

Compound 1-3

The previously synthesized compound 1-2 (4-(4-(4-bromophenyl)butoxy)benzaldehyde)(3.7 g, 11.1 mmol) and (9-phenyl-9H-carbazol-3-yl)boronic acid (4.145 g, 14.43 mmol) were added to a 250 mL round-bottom flask under nitrogen atmosphere and 45 ml of THF was added thereto, and the mixture was completely dissolved. The flask was placed in a 75° C. bath and stirred for 30 minutes. $K_2CO_3$ (4.6 g, 33.3 mmol) was dissolved in 22.5 ml of DI water and then slowly added to the flask. $Pd(P(tBu)_3)_2$ (0.17 g, 0.333 mmol) was added thereto. Then, the resulting mixture was stirred for 2 hours. After completion of the reaction, materials were extracted from brine/EA. The solution was concentrated and purified by a column with Hex:MC (2:1). The resultant product was then concentrated to give 4.75 g of a pale yellow solid (Compound 1-3) (yield: 87%).

[Reaction Scheme 1-4]

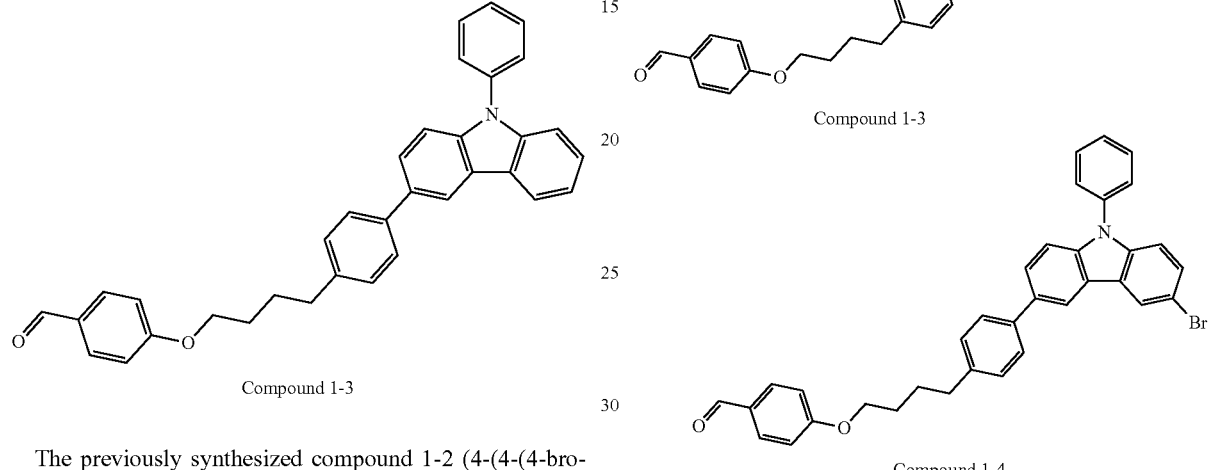

The previously synthesized intermediate (Compound 1-3) (4.8 g, 9.723 mmol) was added to a 250 mL round-bottom flask under nitrogen atmosphere, and 30 ml of DMF was added thereto and completely dissolved. NBC (1.82 g, 10.2 mmol) was dissolved in 10 ml of DMF and added for 30 minutes. The flask was then placed in a 40° C. bath and stirred for 6 hours. The resultant product was precipitated by adding MeOH to recover a white solid (Compound 1-4) (4.9 g) (yield: 95%).

[Reaction Scheme 1-5]

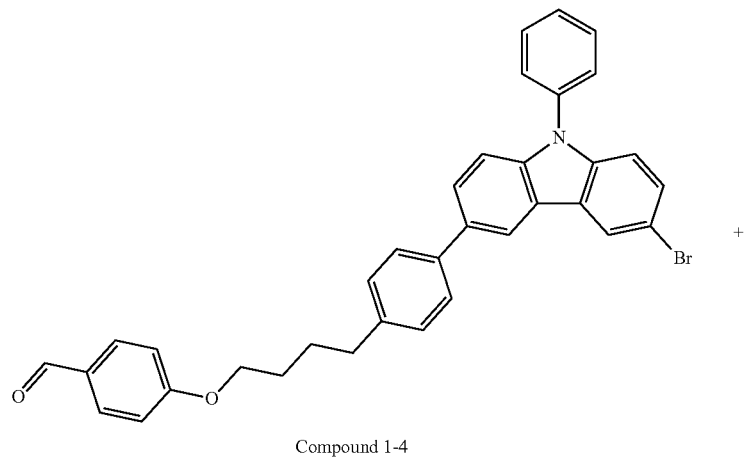

Compound 1-4

-continued

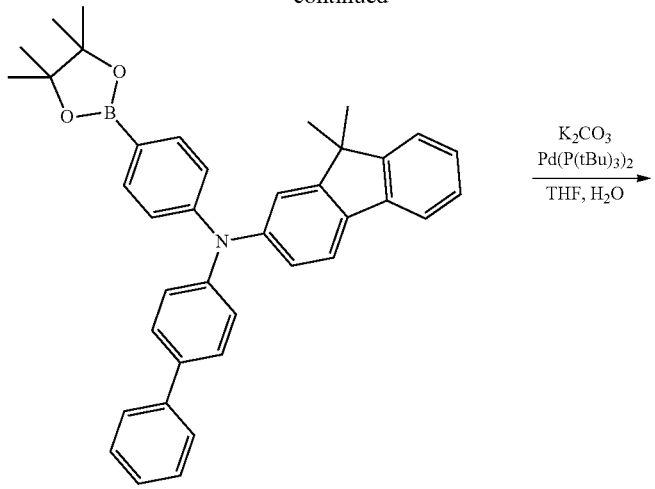

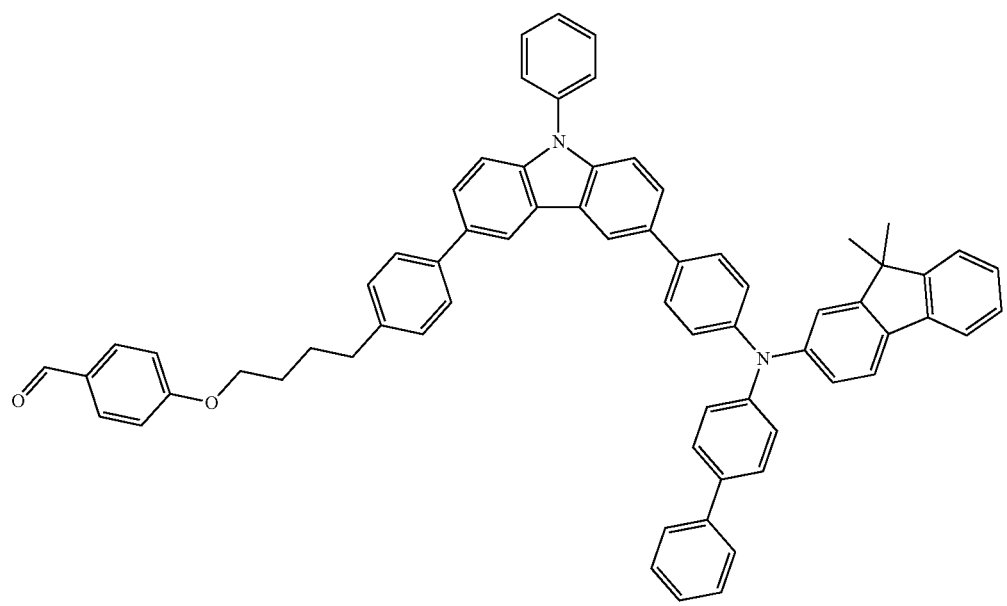

Compound 1-5

The previously synthesized intermediate (Compound 1-4) (4.9 g, 8.616 mmol) and the boronic ester (5.68 g, 11.2 mmol) were added to a 250 mL round-bottom flask under nitrogen atmosphere. 40 ml of THF was added thereto and completely dissolved. The flask was then placed in a 75° C. bath and stirred for 30 minutes. K₂CO₃ (4.6 g, 33.3 mmol) was dissolved in 22.5 ml of DI water and then slowly added to the flask. Then, the mixture was stirred for 30 minutes, and Pd(P(tBu)₃)₂ (0.132 g, 0.258 mmol) was added thereto. Then, the resulting mixture was stirred for 2 hours. After completion of the reaction, materials were extracted from brine/EA. The solution was concentrated and purified by a column with Hex:MC (1:1). The resultant product was then concentrated to give 7.2 g of a pale yellow solid (Compound 1-5) (yield: 78%).

[Reaction Scheme 1-6]

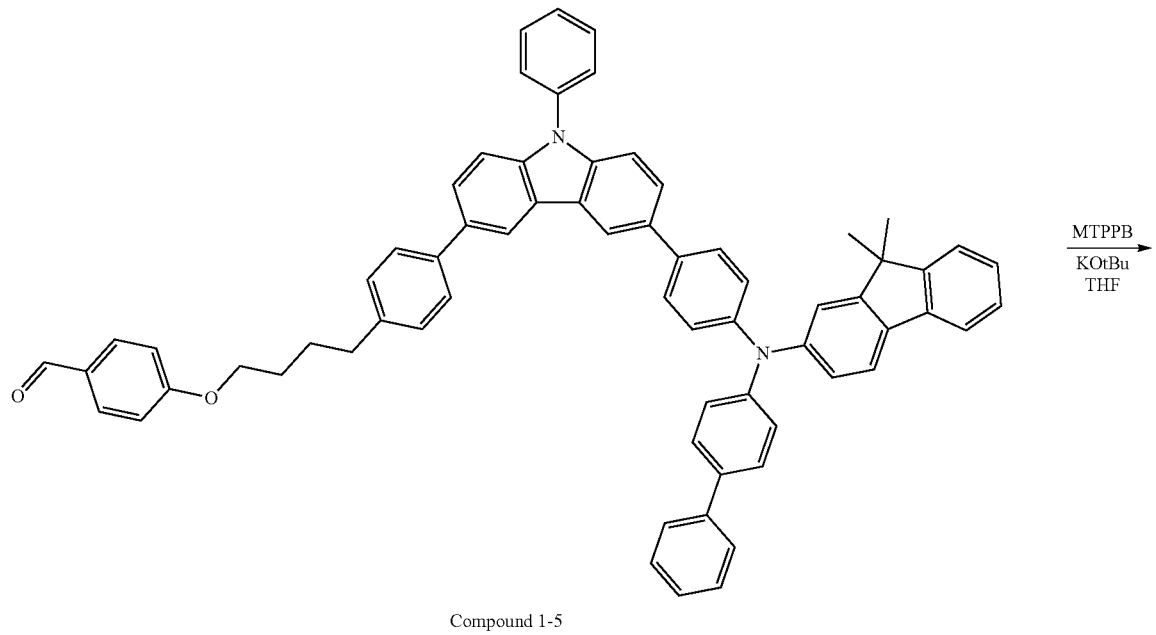

Compound 1-5

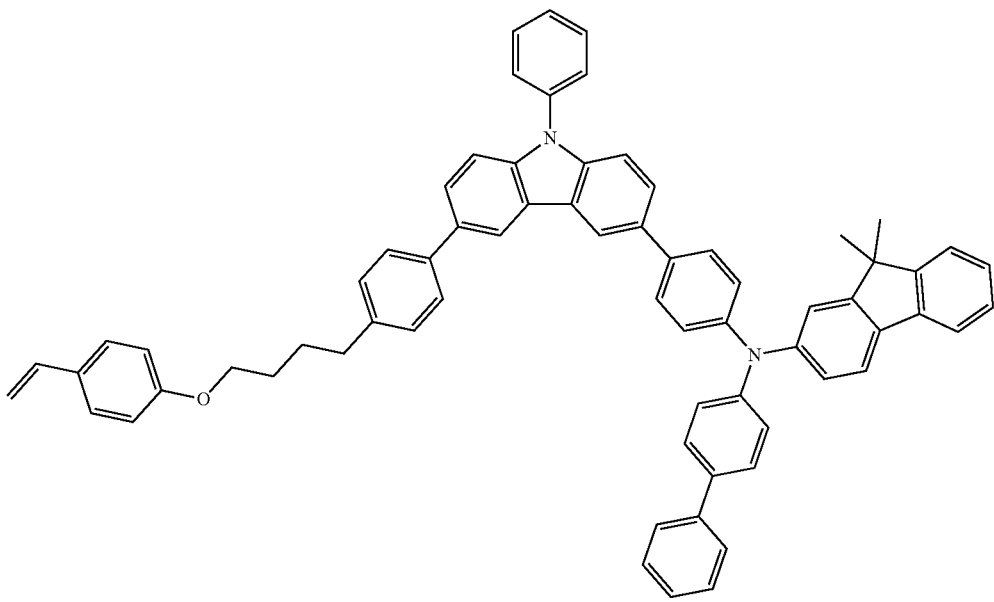

Compound 1-6

Methyltriphenylphosphonium bromide (MTPPB) (9.67 g, 27.06 mmol) and KOtBu (3.04 g, 27.06 mmol) were added to a 250 mL round-bottom flask under nitrogen atmosphere. 100 ml of anhydrous THF was added thereto and the flask was placed in a 0° C. bath and stirred for 30 minutes. Then, the previously synthesized Compound 1-5 (6.2 g, 7.732 mmol) was added to another flask to create a nitrogen atmosphere. Then, 50 ml of THF was added to dissolve it. The flask was placed in a 0° C. bath and stirred for 30 minutes. The previously prepared MTPPB solution was then slowly added thereto. The mixture was further stirred for 30 minutes, and 100 ml of $H_2O$ was added. The aqueous layer and the organic layer were separated, and the organic layer was recovered separately and concentrated. It was then crystallized with EtOH to give a material. Additional purification was performed twice under the conditions of Hex:MC (1:1) to give 5.6 g of Monomer Compound 1-6 (yield: 75%).

[Reaction Scheme 1-7]
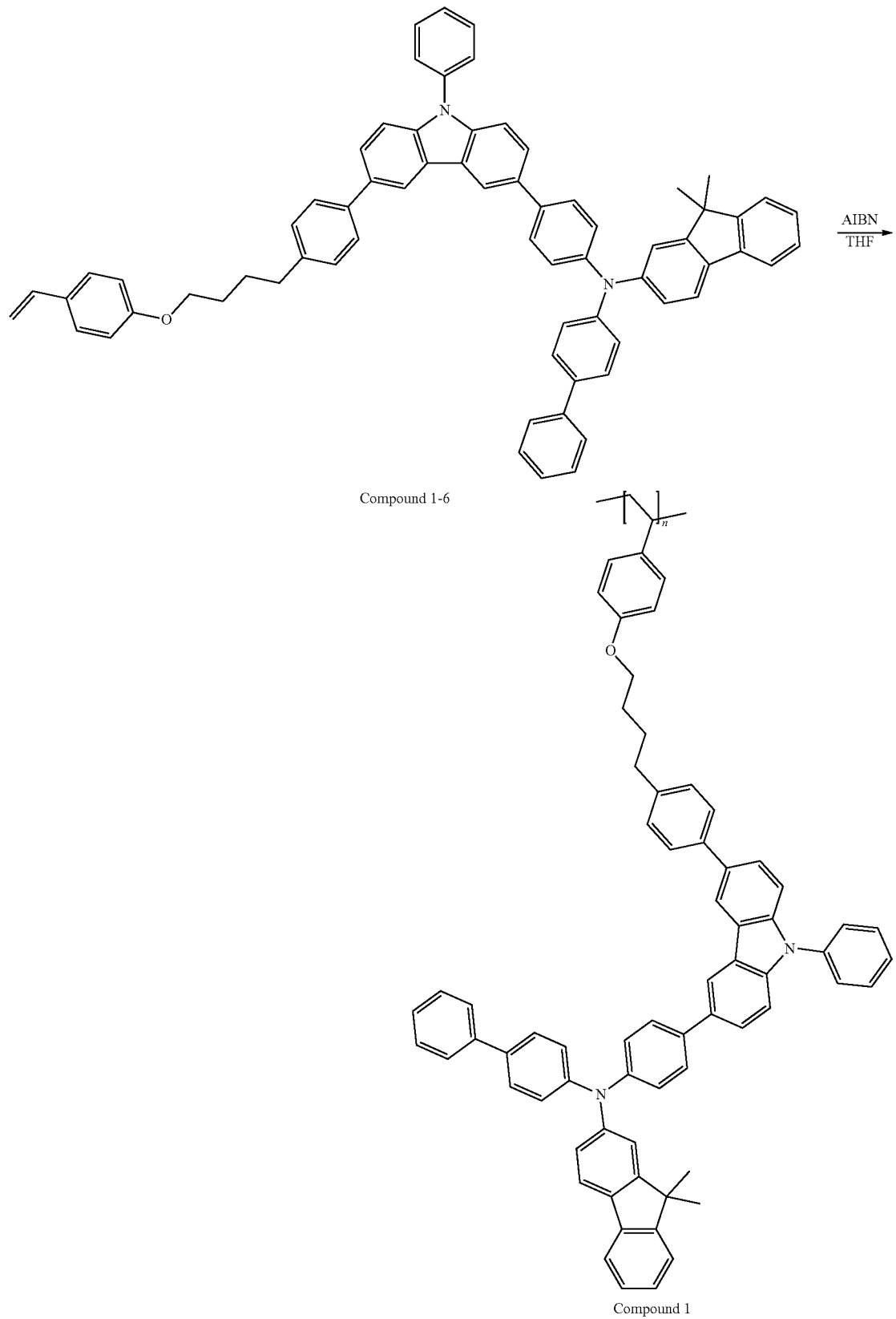
Compound 1-6
Compound 1

1 g of Monomer Compound 1-6 was added to a 10 ml round-bottom flask under nitrogen atmosphere. 4 ml of THF was added and completely dissolved. Then, AIBN 0.01 eq was added thereto. Nitrogen bubbling was performed for 1 hour. Then, the resulting mixture was placed in a 70° C. bath and stirred for 1 hour. Then, sticky gel was slowly added to EA to obtain a white solid. The solid was collected by filtration and column-purified to collect Polymer Compound 1. When molecular weight was confirmed by GPC, it was confirmed as Mn 193 KDa and PDI 2.06 (yield: 50%).

Preparation Example 2: Preparation of Compound 2

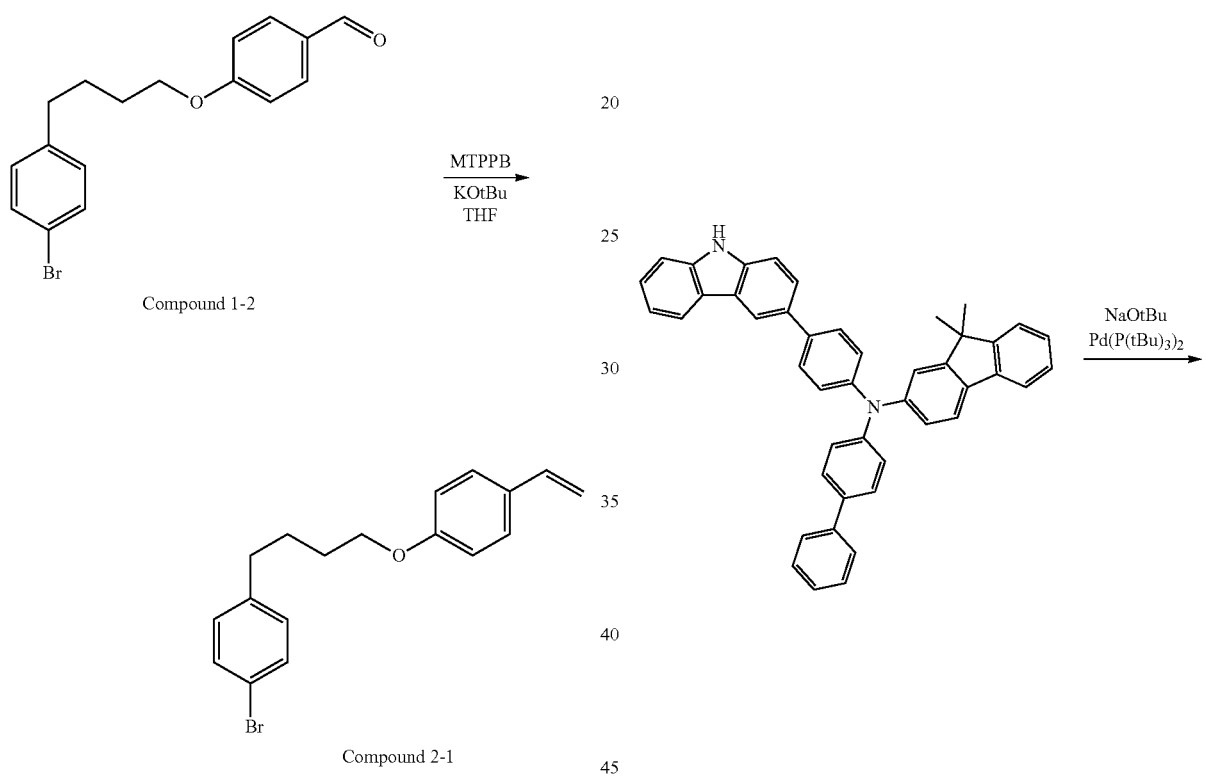

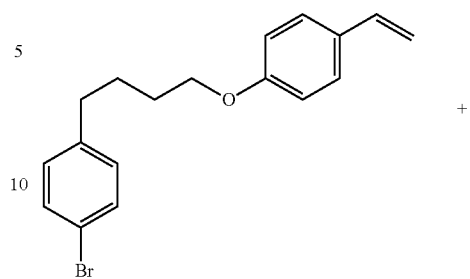

Methyltriphenylphosphonium bromide (MTPPB) (37.5 g, 105 mmol) and KOtBu (11.8 g, 105 mmol) were added to a 500 mL round-bottom flask under nitrogen atmosphere. 200 ml of anhydrous THF was added thereto and the flask was placed in a 0° C. bath and stirred for 30 minutes. Then, the previously synthesized. Compound 1-2 (10 g, 30 mmol) was added to another flask to create a nitrogen atmosphere. Then, 50 ml of THF was added and dissolved. The flask was placed in a 0° C. bath and stirred for 30 minutes. The previously prepared MTPPB solution was then slowly added thereto, The mixture was further stirred for 30 minutes, and 200 ml of H₂O was added. The aqueous layer and the organic layer were separated, and the organic layer was recovered separately and concentrated. It was purified by a column with Hex:EA (8:2) to recover of Compound 2-1 (8.5 g, yield: 85%).

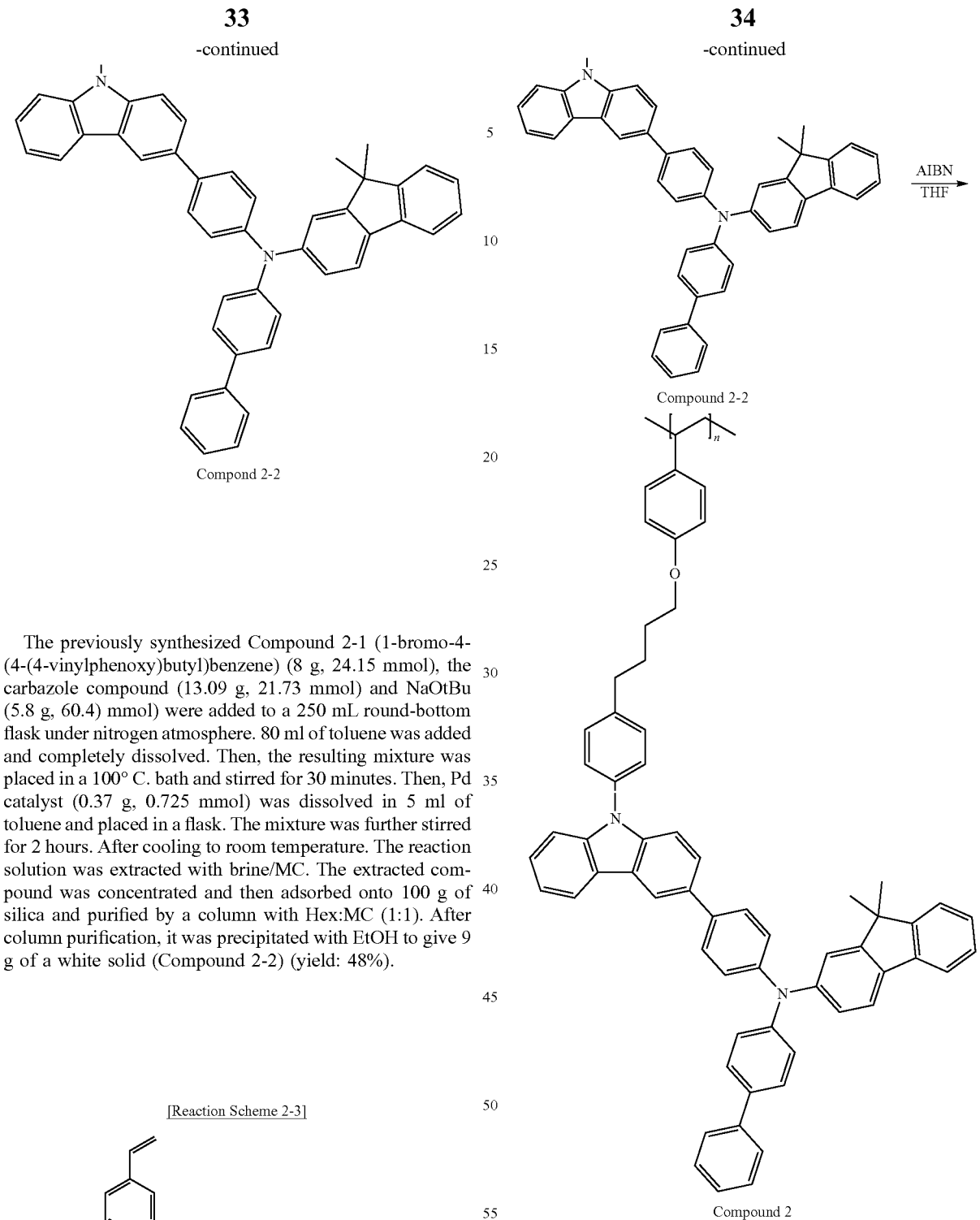

The previously synthesized Compound 2-1 (1-bromo-4-(4-(4-vinylphenoxy)butyl)benzene) (8 g, 24.15 mmol), the carbazole compound (13.09 g, 21.73 mmol) and NaOtBu (5.8 g, 60.4) mmol) were added to a 250 mL round-bottom flask under nitrogen atmosphere. 80 ml of toluene was added and completely dissolved. Then, the resulting mixture was placed in a 100° C. bath and stirred for 30 minutes. Then, Pd catalyst (0.37 g, 0.725 mmol) was dissolved in 5 ml of toluene and placed in a flask. The mixture was further stirred for 2 hours. After cooling to room temperature. The reaction solution was extracted with brine/MC. The extracted compound was concentrated and then adsorbed onto 100 g of silica and purified by a column with Hex:MC (1:1). After column purification, it was precipitated with EtOH to give 9 g of a white solid (Compound 2-2) (yield: 48%).

1 g of compound 2-2 was added to a 10 ml round-bottom flask under nitrogen atmosphere. 4 ml of THF was added and completely dissolved. Then, 0.01 eq of AIBN was added thereto. Bubbling of nitrogen was carried out for 1 hour. Then, the resulting mixture was placed in a 70° C. bath and stirred for 1 hour. Then, sticky gel was slowly added to EA to obtain a white solid. The solid was filtered and collected, and purified by a column to recover Polymer Compound 2. Confirmation of the molecular weight by GPC showed Mn of 159 KDa and PDI of 3.01 (yield: 45%).

Comparative Example 1: Preparation of Comparative Polymer Compound 1

[Reaction Scheme 3-1]

Compound 3-1

Comparative Compound 1

Monomer Compound 3-1 was synthesized using bromostyrene instead of Compound 2-1 in Reaction Scheme 2-2 of Example 2. Thereafter, since the solubility in the polymerization was not good, Comparative Polymer Compound 1 was synthesized in the same manner as in the synthesis method of Compound 2, except that polymerization was performed using 8 ml of THF per 1 g of Monomer Compound 3-1. Confirmation of the molecular weight by CPC showed Mn of 22 KDa and PDI of 2.35.

Comparative Example 2: Preparation of Comparative Compound 2

[Reaction Scheme 4-1]

Compound 1-4

Compound 4-1

Methyltriphenylphosphonium bromide (MTPPB) (9.4 q, 26.3 mmol) and KOtBu (2.95 g, 26.3 mmol) were added to a 200 mL round-bottom flask under nitrogen atmosphere. 50 ml of anhydrous THF was added thereto and the flask was placed in a 0° C. bath and stirred for 30 minutes. Then, the previously synthesized. Compound 1-4 (4.3 g, 7.5 mmol) of Example 1 was added to another flask to create a nitrogen atmosphere. Then, 25 ml of THF was added and dissolved. The flask was placed in a 0° C. bath and stirred for 30 minutes. The previously prepared MTPPB solution was then slowly added thereto. The mixture was further stirred for 30 minutes, and 200 ml of $H_2O$ was added. The aqueous layer and the organic layer were separated, and the organic layer was recovered separately and concentrated. It was then precipitated with EtOH to recover 3.8 g of a white solid (Compound 4-1) (yield: 85%).

[Reaction Scheme 4-2]
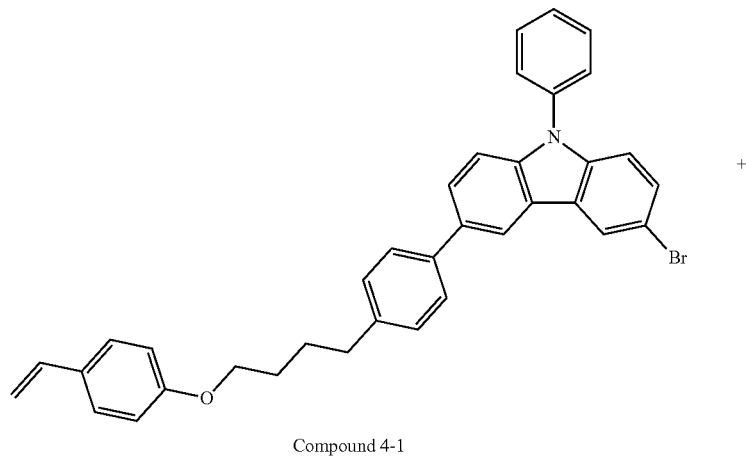
Compound 4-1
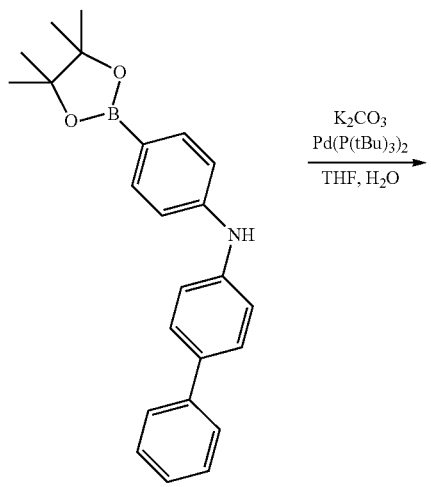
K₂CO₃
Pd(P(tBu)₃)₂
———————→
THF, H₂O
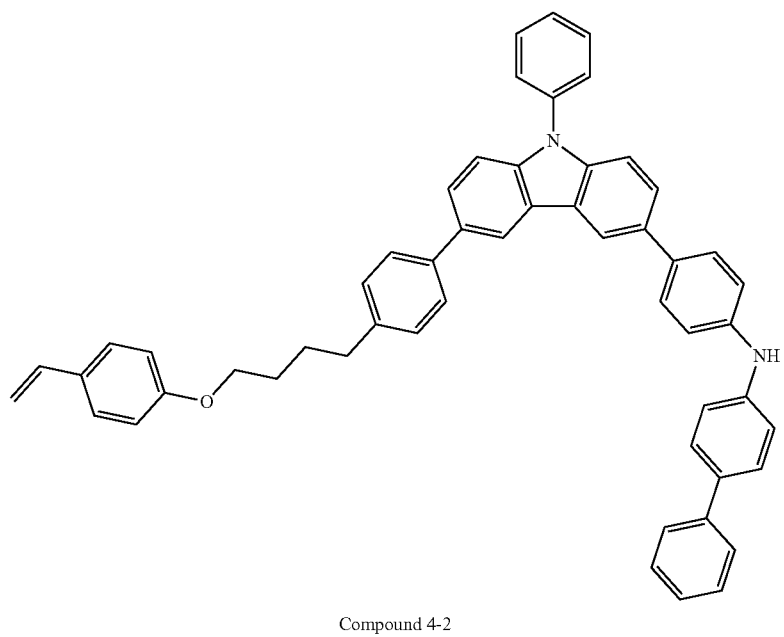
Compound 4-2

The previously synthesized Compound 4-1 (3.8 g, 6.63 mmol) and the boronic ester (2.1 g, 5.53 mmol) were added to a 250 mL round-bottom flask under nitrogen atmosphere. 40 ml of THF was added and completely dissolved. The flask was then placed in 75° C. bath and stirred for 30 minutes. K$_2$CO$_3$ (2.8 g, 19.9 mmol) was dissolved in. 15 ml of DI water and then slowly added to the flask. Then, the mixture was stirred for 30 minutes, and Pd(P(tBu)$_3$)$_2$ (0.1 g, 0.199 mmol) was added thereto. Then, the resulting mixture was stirred for 2 hours. After completion of the reaction, materials were extracted from brine/EA. The solution was concentrated and purified by a column with Hex:MC (1:1). The resultant product was then concentrated to give 3.5 g of a pale yellow solid (Compound 4-2) (yield: 72%).

[Reaction Scheme 4-3]

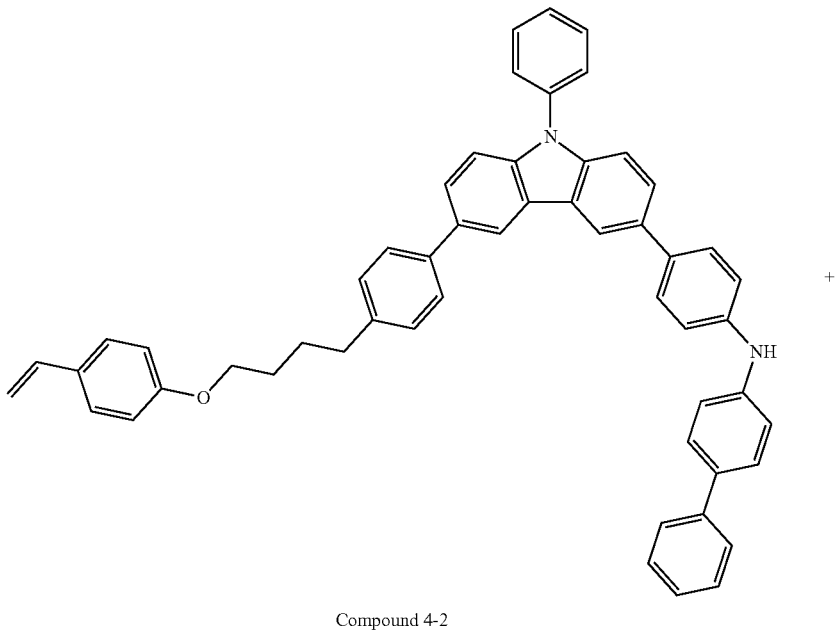

Compound 4-2

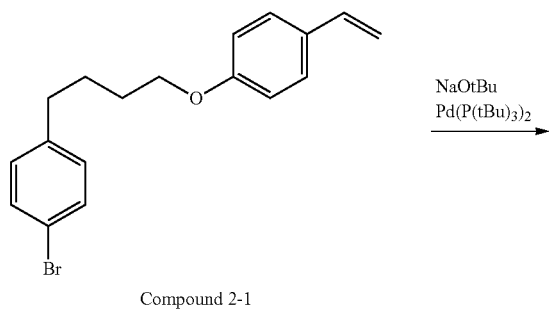

Compound 2-1

-continued

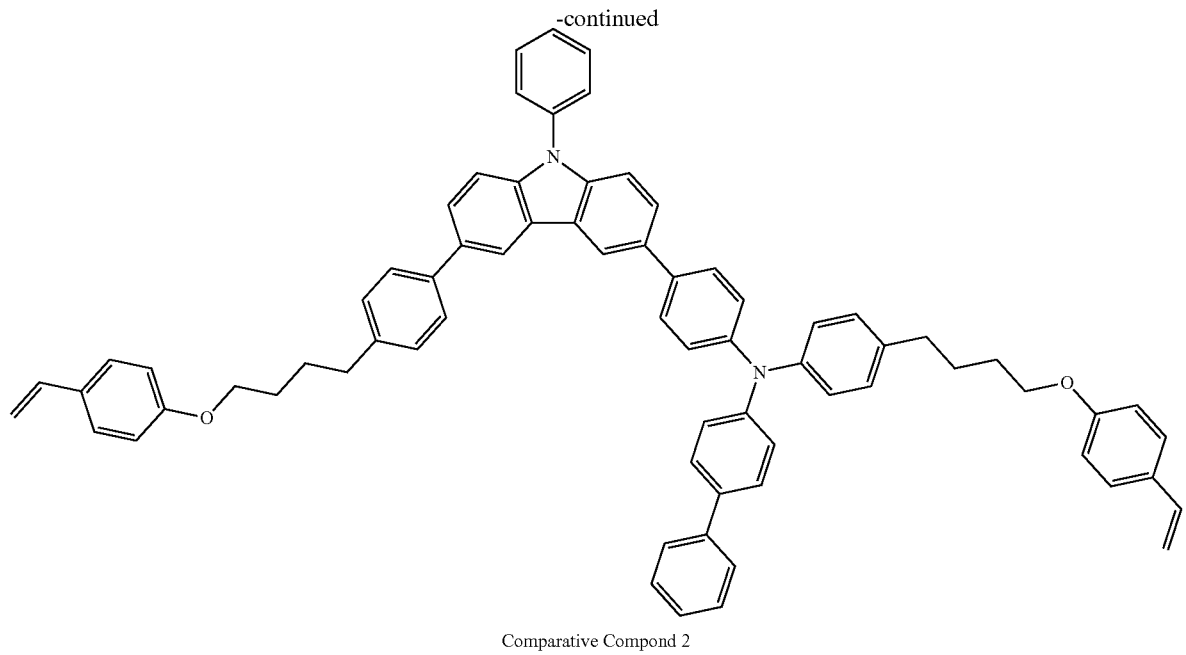

Comparative Compond 2

The previously synthesized Compound 2-1 (1-bromo-4-(4-(4-vinylphenoxy)butyl)benzene) (1.6 g, 4.75 mmol) of Example 2, the above synthesized Compound 4-2 (3.5 g, 4.75 mmol) and NaOtBu (1.37 g, 14.3 mmol) were added to a 100 mL round-bottom flask under nitrogen atmosphere. 20 ml of toluene was added and completely dissolved. Then, the mixture was paced in a 100° C. bath and stirred for 30 minutes. Pd catalyst (0.08 g, 0.143 mmol) was dissolved in 5 ml of toluene and added to a flask. The resulting mixture was further stirred for 2 hours. After cooling to room temperature, the reaction solution was extracted with brine/MC. The extracted compound was concentrated and then adsorbed onto 20 g of silica and purified by a column with Hex:MC (1:1). After column purification, it was precipitated with EtOH to give 2.8 g of a white solid (Compound 2) (yield: 60%).

Experimental Example 1: Manufacture of Organic Light Emitting Device

A glass substrate on which ITO (indium tin oxide) was coated as a thin film to a thickness of 1,500 Å was put into distilled water in which a detergent was dissolved, and ultrasonically cleaned. In this case, a product manufactured by Fischer Co. was used as the detergent, and as the distilled water, distilled water filtered twice using a filter manufactured by Millipore Co. was used. After the ITO was cleaned for 30 minutes, ultrasonic cleaning was repeated twice using distilled water for 10 minutes. After the cleaning with distilled water was completed, the substrate was ultrasonically cleaned with solvents of isopropyl alcohol and acetone, dried, and then the substrate was cleaned for 5 minutes, and then transferred to a glove box.

2 wt/v % toluene coating composition of the Compound 1 and a compound M below (weight ratio of 8:2) was spin-coated (4000 rpm) on the ITO transparent electrode and heat-treated (cured) at 200° C. for 30 minutes to form a hole injection layer with a thickness of 40 nm. After being transferred to a vacuum depositor, a compound G below was vacuum-deposited on the hole injection layer to form a hole transport layer with a thickness of 20 nm. A compound H below and a compound I below were vacuum-deposited at a weight ratio of 92:8 on the hole transport layer to a thickness of 20 nm to form a light emitting layer. A compound J below was vacuum-deposited on the light emitting layer to a thickness of 35 nm to form an electron injection and transport layer. LiF (1 nm) and aluminum (100 nm) were sequentially deposited on the electron injection and transport layer to form a cathode.

In the above-mentioned process, the vapor deposition rate of the organic material was maintained at 0.4 to 0.7 Å/sec, the deposition rate of LiF was maintained at 0.3 Å/sec, the deposition rate of aluminum was maintained at 2 Å/sec, and the degree of vacuum during the deposition was maintained at $2\times10^{-7}$ to $5\times10^{-8}$ torr.

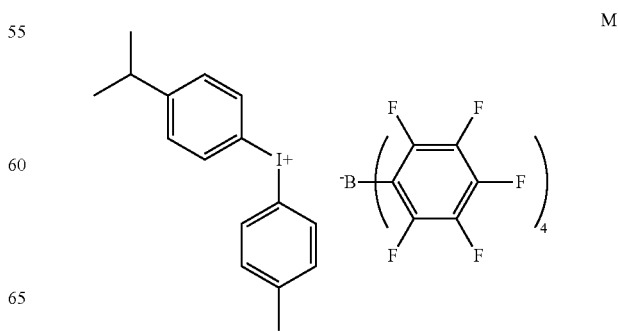

M

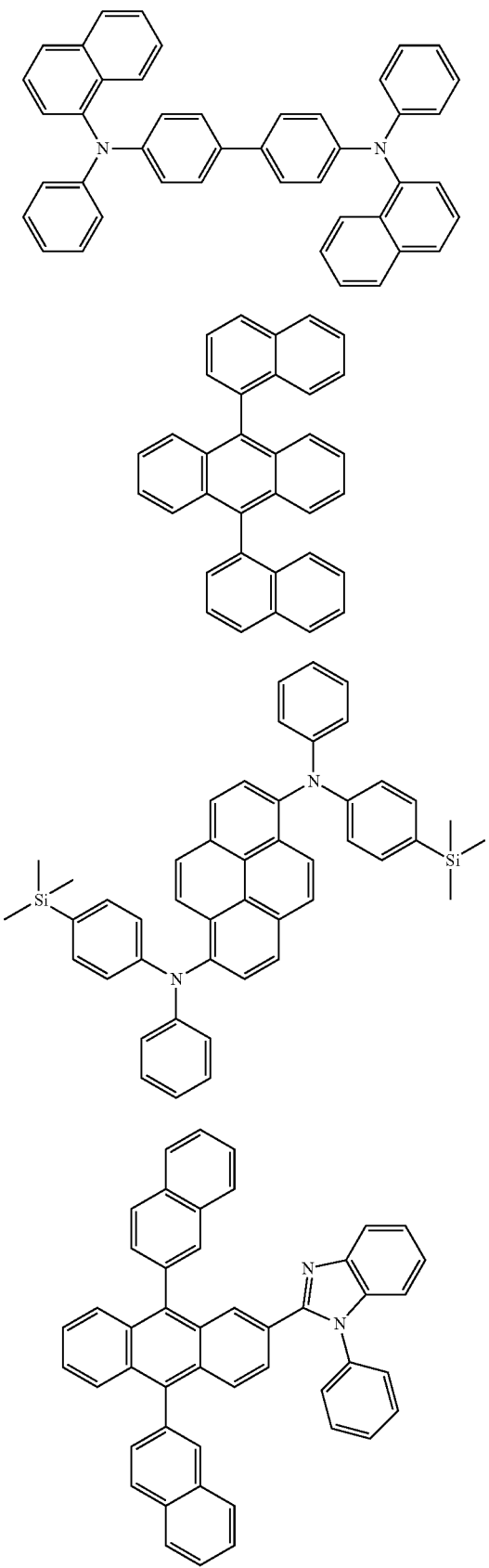

Experimental Example 2, Comparative Experimental Examples 1 and 2

The organic light emitting device was manufactured in the same manner as in Experimental Example 1, except that the Polymer Compounds shown in Table 1 below were used instead of Polymer Compound 1.

Device Evaluation

The driving voltage, external quantum efficiency (EQE), luminance and lifetime were measured at a current density of 10 mA/cm² for the organic light emitting devices manufactured in Experimental Examples and Comparative Experimental Example above, and the results are shown in Table 1 below. The external quantum efficiency was calculated by (number of emitted photons)/(number of injected charge carriers). T90 means the time required for the luminance to be reduced to 90% of the initial luminance (500 nit).

TABLE 1

| Category | Hole transport layer | Driving voltage (V) | Current density (mA/cm²) | EQE (%) | Lifetime (hr) (T90 at 500 nit) |
|---|---|---|---|---|---|
| Experimental Example 1 | Compound 1 | 4.48 | 10 | 6.4 | 173 |
| Experimental Example 2 | Compound 2 | 4.97 | 10 | 7.2 | 140 |
| Comparative Experimental Example 1 | Comparative Compound 1 | 4.51 | 10 | 6.3 | 2 |
| Comparative Experimental Example 2 | Comparative Compound 2 | 5.02 | 10 | 7.3 | 46 |

As shown in Table 1, it could be confirmed that since the polymer compound 1 and the compound 2 according to an embodiment of the present invention constitute a polymer including a linker, they exhibited greatly increased efficiency and lifetime as compared with the comparative compound 1 which is not so. In addition, since the polymer of the present invention has no steric hindrance due to the linker structure, it is easy to synthesize a high molecular weight polymer, and at the same time, it has excellent solubility in an organic solvent, thereby facilitating the preparation of the coating composition. In particular, it was confirmed that since it forms uniform coating layer and is excellent in film stability, compared with the case of using the Comparative Compound 1, it can exhibit superior performance in the organic light emitting device.

Further, as shown in Table 1, it was confirmed that the polymer according to an embodiment of the present invention is remarkably excellent in lifetime characteristics as compared with the case of using Comparative Compound 2 having two curing groups. When using monomers other than polymers, unpolymerized monomers can interfere with the transfer of holes, and it may be introduced into the light emitting layer to cause a decrease in device lifetime. It was confirmed that the polymer of the present invention improves the disadvantages of the monomer, and thus is excellent in the solvent resistance of the film, thereby showing superior performance in the organic light emitting device.

EXPLANATION OF SIGN

1: substrate
2: anode
3: light emitting layer
4: cathode
5: hole injection layer
6: hole transport layer
7: light emitting layer
8: electron transport layer

The invention claimed is:

1. A polymer comprising a repeating unit represented by the following Chemical Formula 1:

[Chemical Formula 1]

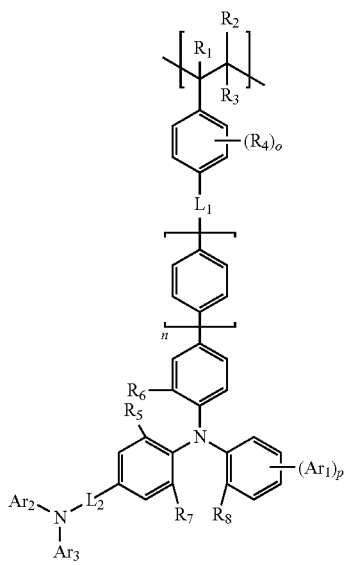

wherein, in Chemical Formula 1,
$L_1$ is $-C_4H_8-$, $-C_5H_{10}-$, $-C_6H_{12}-$, $-OC_4H_8-$, $-OC_5H_{10}-$, $-OC_6H_{12}-$, $-(OC_2H_4)_2-$, $-(OC_2H_4)_3-$, $-O(C_2H_4)O(C_3H_6)O(C_2H_4)-$, $-C_4F_8-$, $-C_5F_{10}-$, $-C_6F_{12}-$, $-OC_4F_8-$, $-OC_5F_{10}-$, $-OC_6F_{12}-$, $-(OC_2F_4)_2-$ or $-(OC_2F_4)_3-$,
$L_2$ is a single bond or a substituted or unsubstituted $C_{6-60}$ arylene,
each $Ar_1$ is independently hydrogen, $C_{1-10}$ alkyl, or a substituted or unsubstituted $C_{6-60}$ aryl,
$Ar_2$ and $Ar_3$ are each independently a substituted or unsubstituted $C_{6-60}$ aryl,
$R_1$, $R_2$ and $R_3$ are each independently hydrogen or $C_{1-10}$ alkyl,
each $R_4$ is independently hydrogen or halogen,
$R_5$ and $R_6$ are hydrogen or are linked together to form a single bond,
$R_7$ and $R_8$ are hydrogen or are linked together to form a single bond, with the proviso that the case where both $R_5$ and $R_6$, and $R_7$ and $R_8$ are linked together to form a single bond is excluded,
o is an integer from 0 to 4,
p is an integer from 0 to 4, and
n is 0 or 1.

2. The polymer according to claim 1, wherein the polymer has a weight average molecular weight of 5,000 to 500,000.

3. The polymer according to claim 1, wherein the repeating unit represented by Chemical Formula 1 is any one selected from repeating units represented by the following Chemical Formulas 2 to 4:

[Chemical Formula 2]

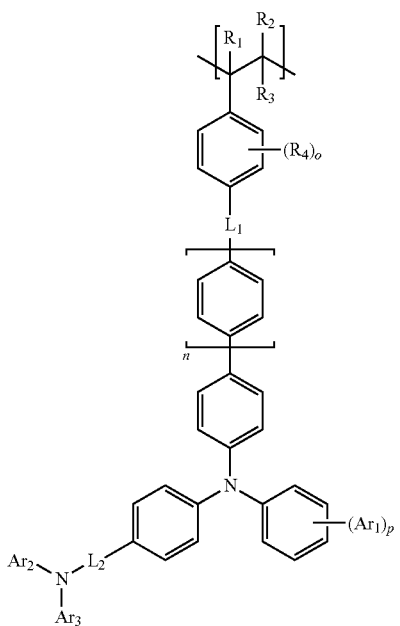

[Chemical Formula 3]

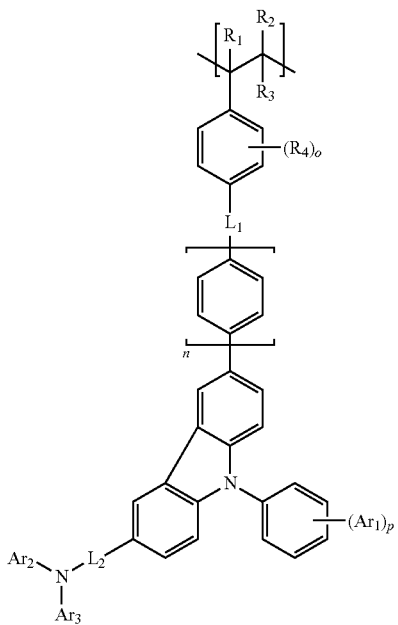

[Chemical Formula 4]

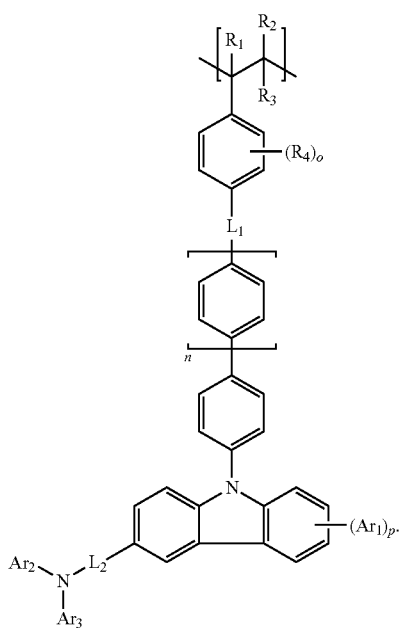

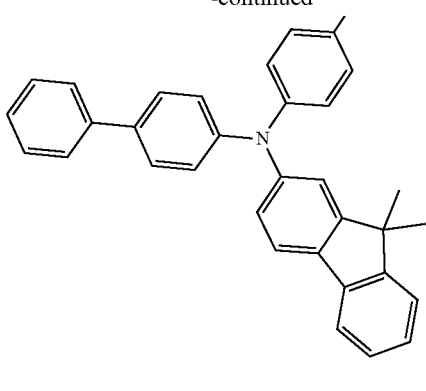

4. The polymer according to claim 1, wherein
L$_2$ is a single bond, phenylene, or biphenylylene.
5. The polymer according to claim 1, wherein
Ar$_2$ and Ar$_3$ are each independently phenyl, biphenylyl, dimethylfluorenyl, or diphenylfluorenyl unsubstituted or substituted with methyl, ethyl, propyl, isopropyl, butyl, isobutyl or tertbutyl.
6. The polymer according to claim 1, wherein
R$_1$, R$_2$ and R$_3$ are each independently hydrogen or methyl.
7. The polymer according to claim 1, wherein
R$_4$ is hydrogen or fluoro.
8. The polymer according to claim 1, wherein
the Chemical Formula 1 is any one selected from the group consisting of repeating units represented by the following:

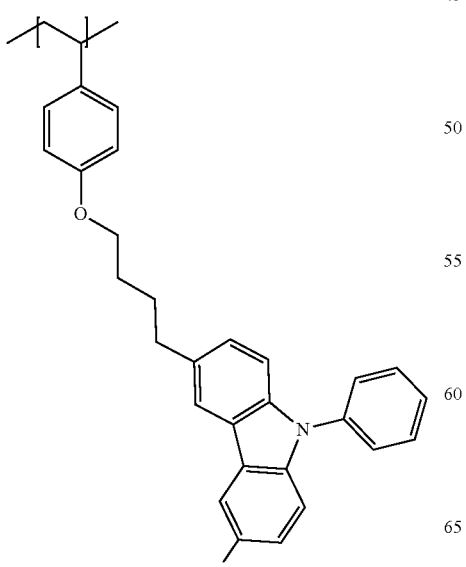

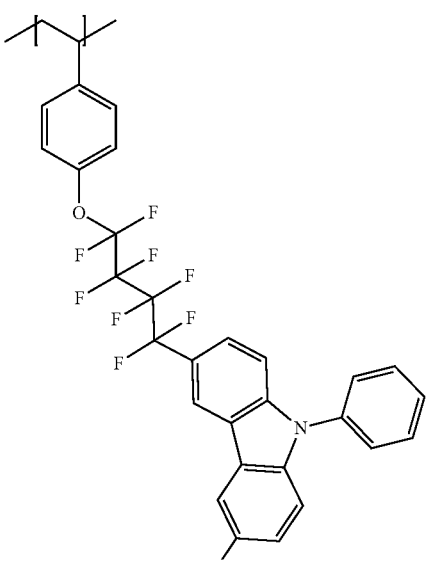

49
-continued
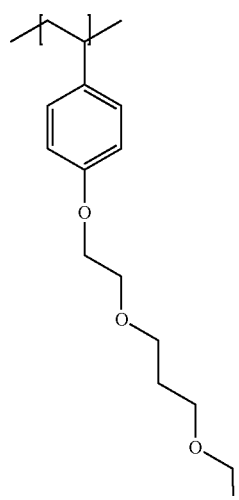
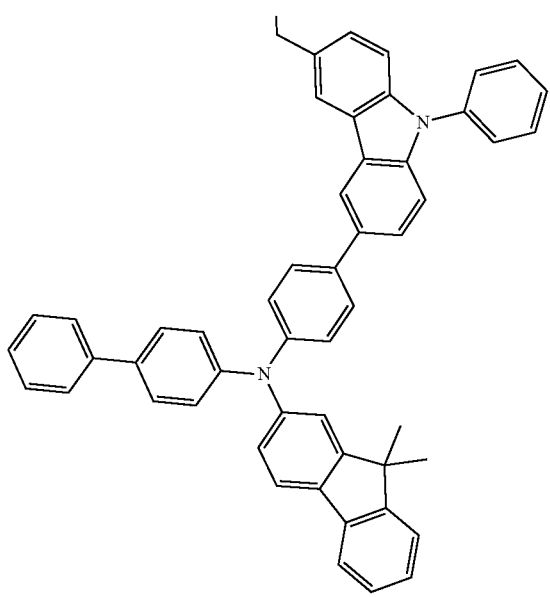
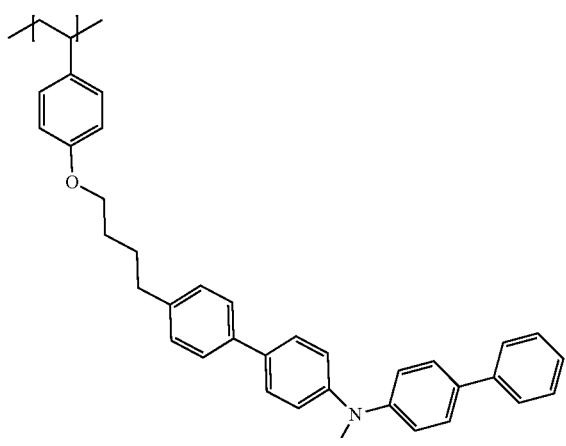
50
-continued
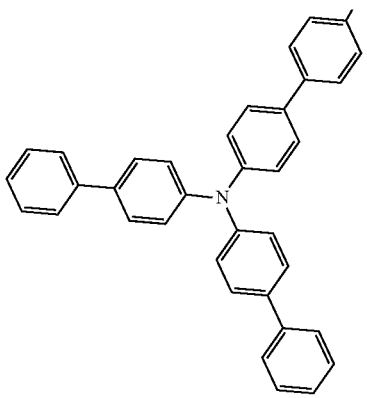
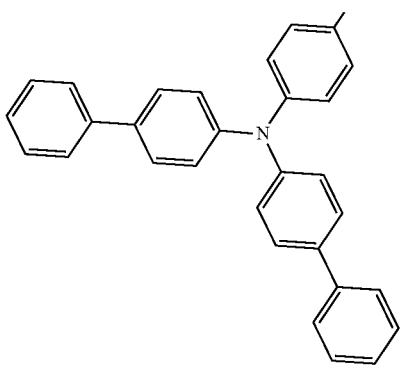

51
-continued
52
-continued
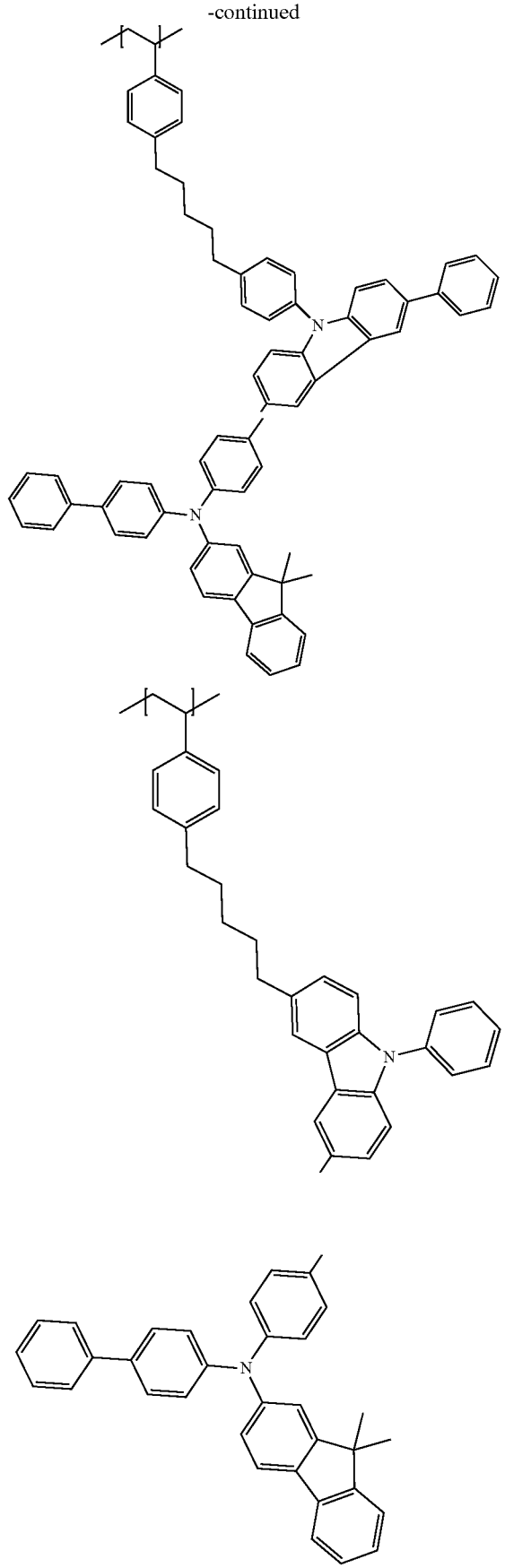
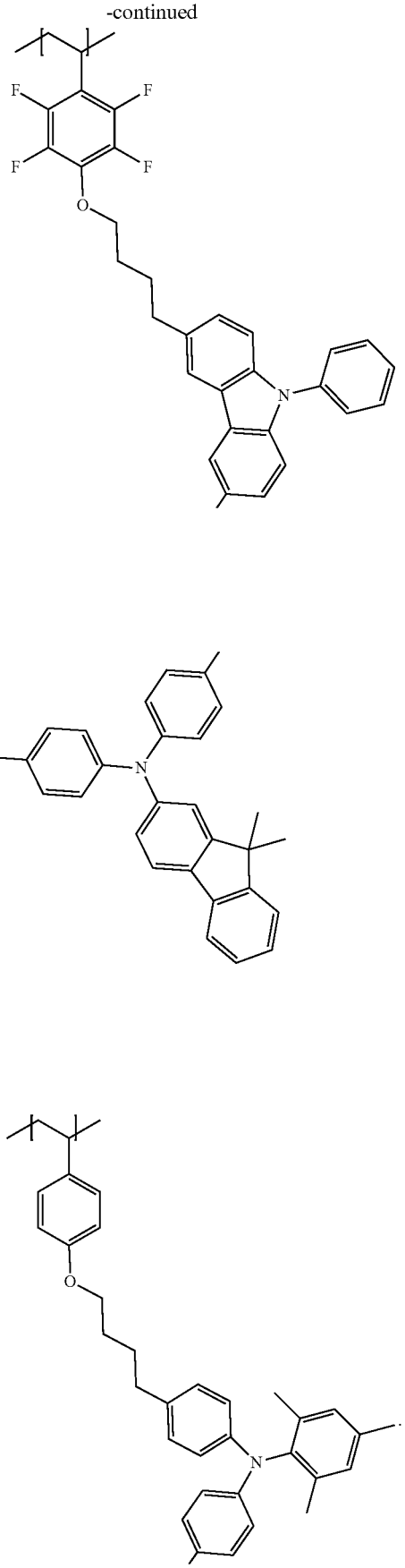

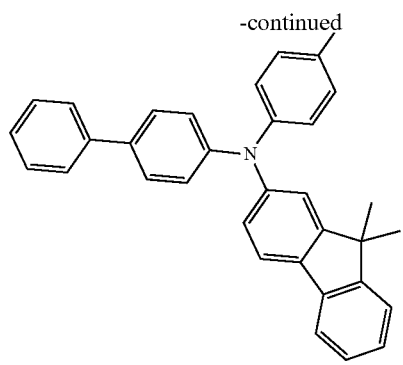

9. An organic light emitting device comprising a first electrode; a second electrode that is disposed opposite to the first electrode; and one or more organic material layers that are disposed between the first electrode and the second electrode, wherein the one or more organic material layers include the polymer according to claim 1.

10. The organic light emitting device according to claim 9, wherein
the one or more organic material layers including the polymer are selected from a hole injection layer or a hole transport layer.

11. The organic light emitting device according to claim 9, wherein the polymer comprises a repeating unit represented by any one selected from the group consisting of repeating units represented by the following:

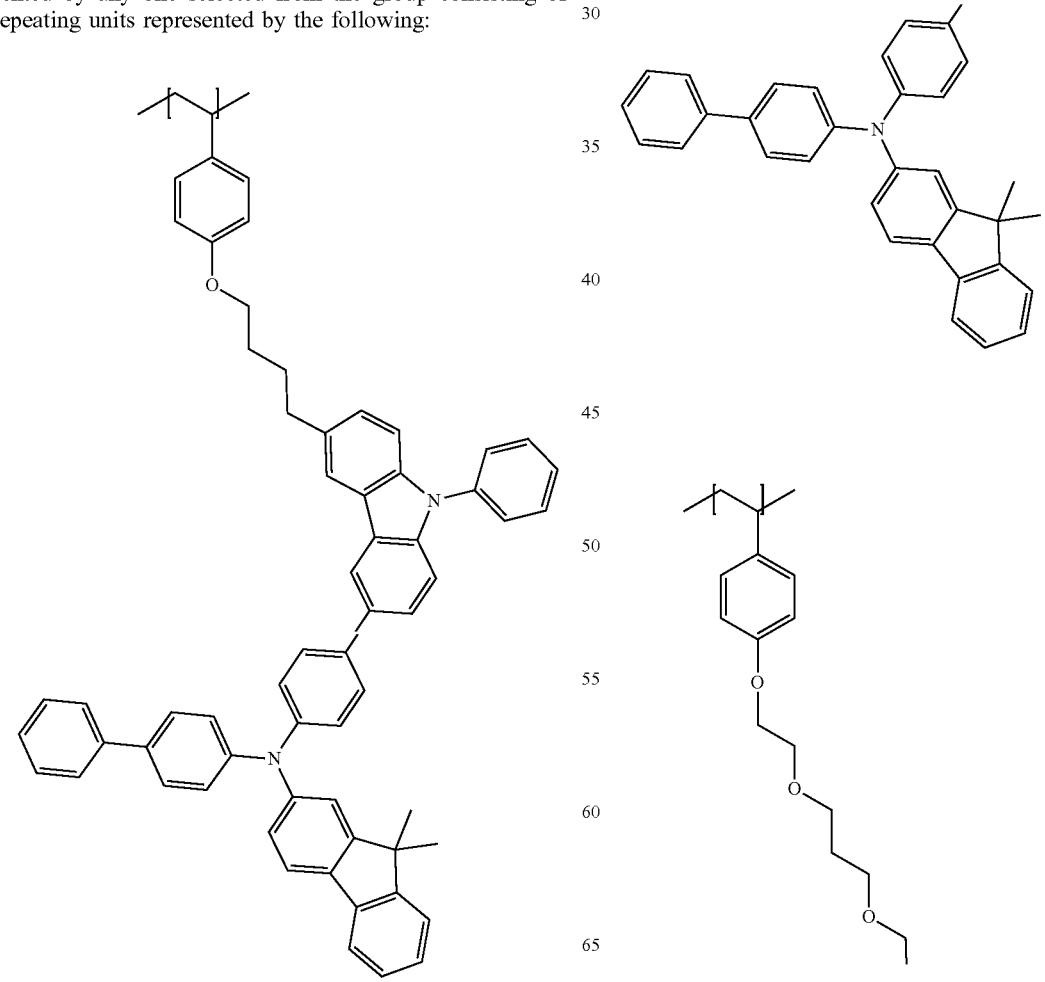

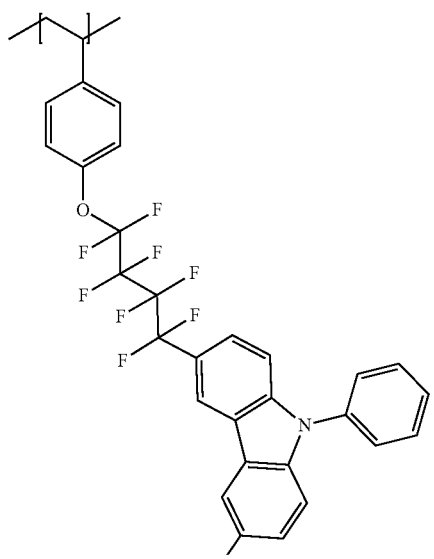

55
-continued
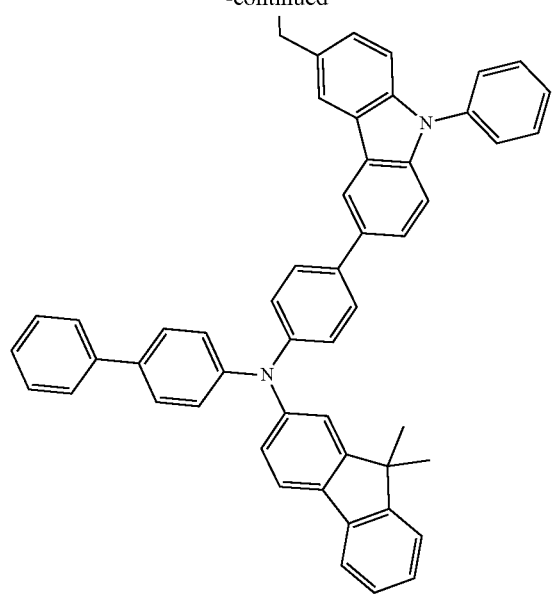
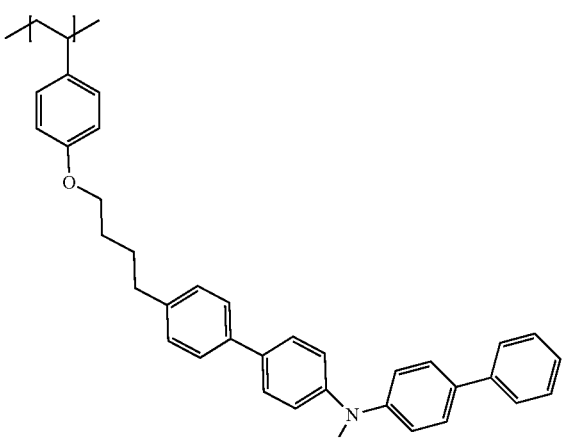
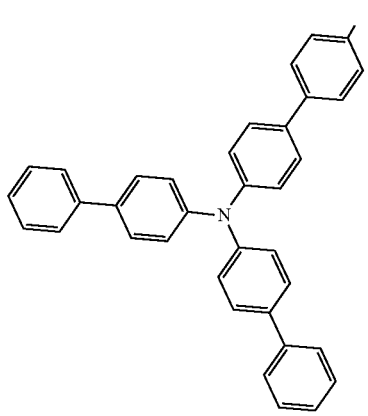
56
-continued
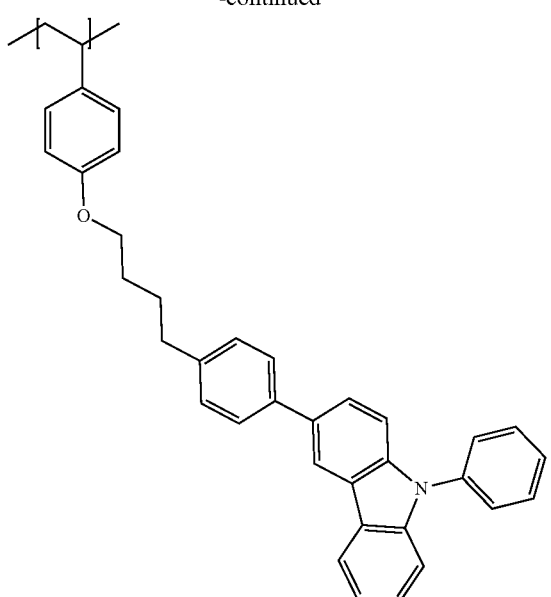
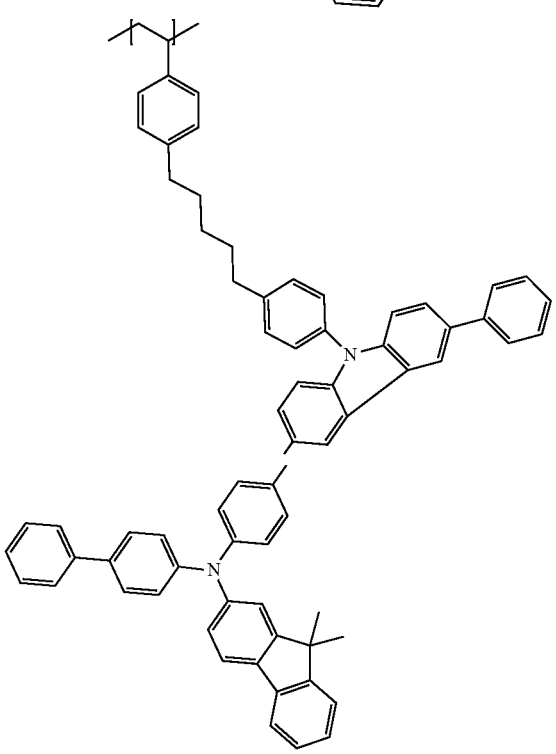

57
-continued
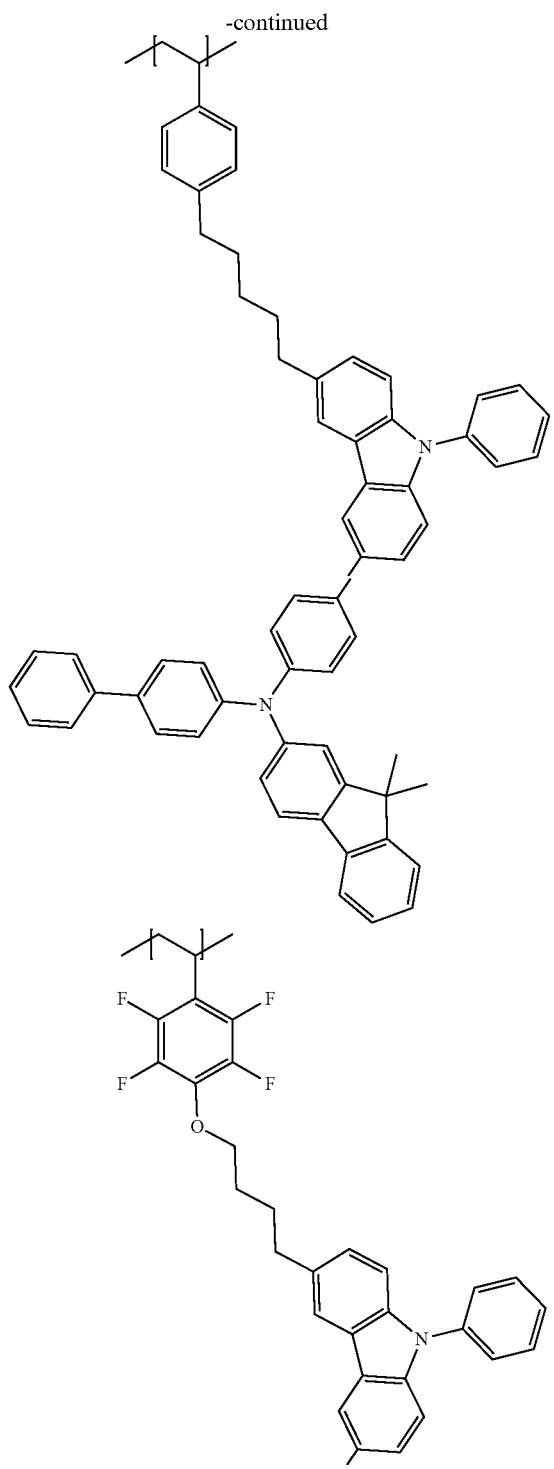
58
-continued
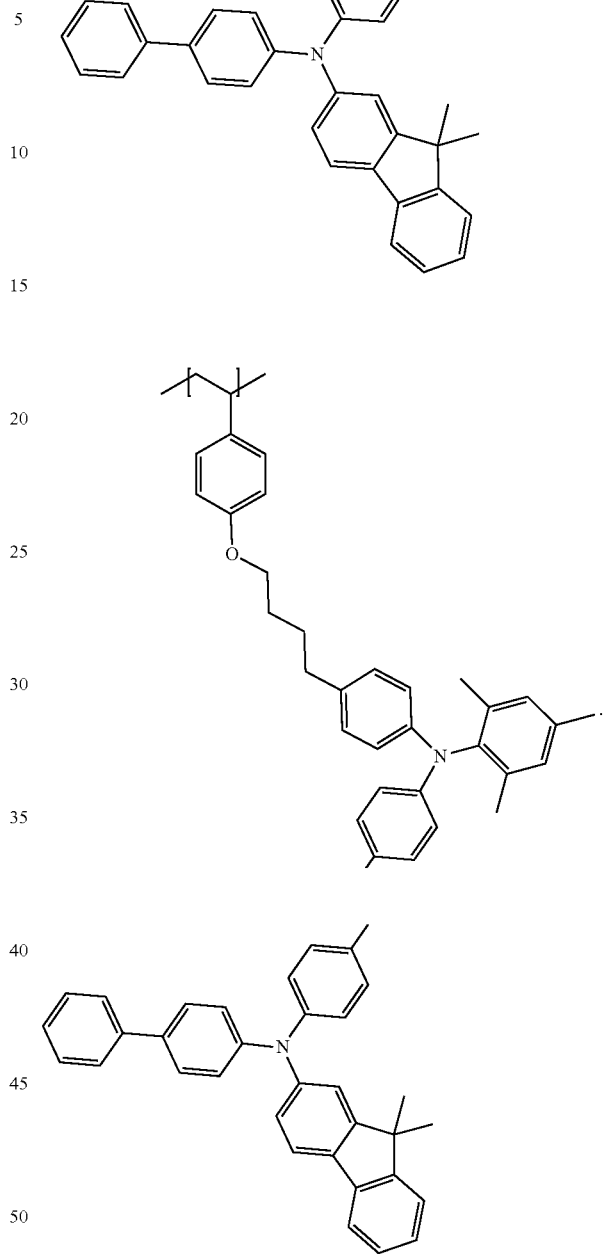
12. The polymer according to claim 1, wherein Ar1 is independently hydrogen, methyl, or phenyl.
* * * * *